(12) United States Patent
Testa

(10) Patent No.: US 12,464,677 B2
(45) Date of Patent: Nov. 4, 2025

(54) FLEXIBLE MEMBRANE CONTAINER FOR THERMAL MANAGEMENT OF AN ELECTRONIC OBJECT

(71) Applicant: SLICIP, Inc., Tyler, TX (US)

(72) Inventor: Gary D. Testa, St. Petersburg, FL (US)

(73) Assignee: SLICIP, INC., Tyler, TX (US)

( * ) Notice: Subject to any disclaimer, the term of this patent is extended or adjusted under 35 U.S.C. 154(b) by 0 days.

(21) Appl. No.: 18/612,374

(22) Filed: Mar. 21, 2024

(65) Prior Publication Data

US 2024/0324141 A1    Sep. 26, 2024

Related U.S. Application Data

(60) Provisional application No. 63/515,271, filed on Jul. 24, 2023, provisional application No. 63/453,706, filed on Mar. 21, 2023.

(51) Int. Cl.
   *H05K 7/20* (2006.01)
(52) U.S. Cl.
   CPC .................. *H05K 7/20272* (2013.01)
(58) Field of Classification Search
   None
   See application file for complete search history.

(56) References Cited

U.S. PATENT DOCUMENTS

| | | |
|---|---|---|
| 5,245,508 A | 9/1993 | Mizzi |
| 5,485,671 A | 1/1996 | Larson et al. |
| 10,188,017 B2 | 1/2019 | Gauthier et al. |
| 10,485,137 B2 | 11/2019 | Helsel et al. |
| 10,624,236 B2 * | 4/2020 | Inano ................ H05K 7/20236 |
| 11,006,547 B2 | 5/2021 | Gao |
| 11,026,344 B2 * | 6/2021 | Midgley .................. G06F 1/20 |
| 11,032,941 B2 | 6/2021 | Le et al. |

(Continued)

FOREIGN PATENT DOCUMENTS

| | | |
|---|---|---|
| WO | WO 2020/216954 A1 | 10/2020 |
| WO | WO 2022/027145 A1 | 2/2022 |

OTHER PUBLICATIONS

International Search Report and Written Opinion for International Application No. PCT/US2024/020997, dated Jun. 3, 2024.

(Continued)

*Primary Examiner* — Courtney L Smith
(74) *Attorney, Agent, or Firm* — Stephen E. Kelly; Andriy Lytvyn; Hill Ward Henderson, P.A.

(57) ABSTRACT

A flexible membrane container for thermal management of an electronic object, the flexible membrane container comprising a first flexible membrane defining a bag-like container having a first interior volume, the container having an opening for removably receiving an electronic object. At least one outflow conduit is disposed in fluid communication with the first interior volume, and at least one inflow conduit is disposed in fluid communication with the first interior volume, thereby enabling a liquid dielectric coolant from a source external to the flexible membrane container to enter into the first interior volume. An insert frame member having a header is configured for releasably attaching to the electronic object. The header provides controls and power connectivity for electronic communication with the electronic object.

26 Claims, 32 Drawing Sheets

(56) References Cited

U.S. PATENT DOCUMENTS

| | | | |
|---|---|---|---|
| 11,483,949 B2* | 10/2022 | Keehn | H05K 7/203 |
| 11,889,658 B2* | 1/2024 | Gao | H05K 7/20781 |
| 2018/0020571 A1 | 1/2018 | Saito | |
| 2020/0323108 A1 | 10/2020 | Bilan et al. | |
| 2020/0375059 A1 | 11/2020 | Keehn et al. | |
| 2022/0151097 A1 | 5/2022 | McManis et al. | |
| 2022/0279674 A1* | 9/2022 | Manousakis | H05K 7/20809 |
| 2022/0322576 A1* | 10/2022 | Chehade | G06F 1/20 |
| 2022/0361381 A1 | 11/2022 | Sweeney et al. | |
| 2022/0369504 A1* | 11/2022 | Clerc | H05K 7/20236 |
| 2023/0032562 A1 | 2/2023 | Sweeney et al. | |
| 2023/0084765 A1* | 3/2023 | Gao | H05K 7/20254 |
| | | | 361/679.53 |

OTHER PUBLICATIONS

International Search Report and Written Opinion for International Application No. PCT/US23/21150, dated Sep. 12, 2023.
U.S. Appl. No. 18/675,691, filed May 28, 2024, Testa, et al., US 2024-0314974 A1, Jul. 29, 2024.

* cited by examiner

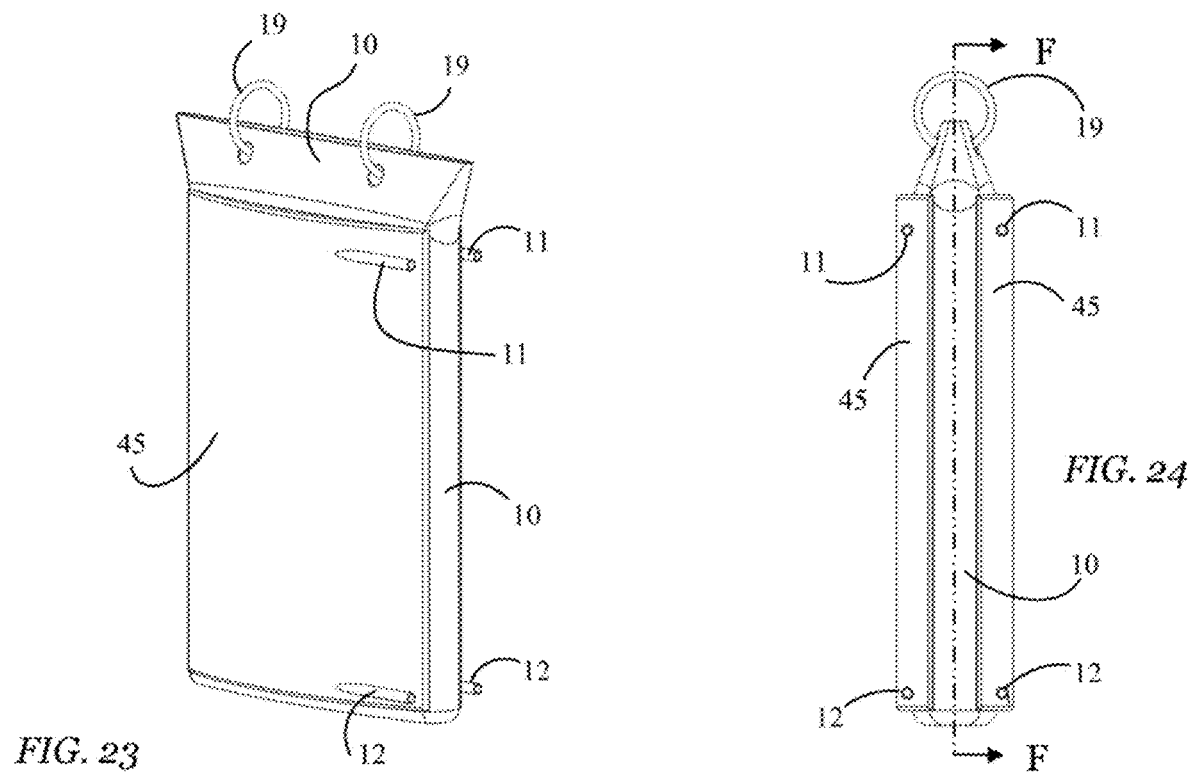
FIG. 23
FIG. 24
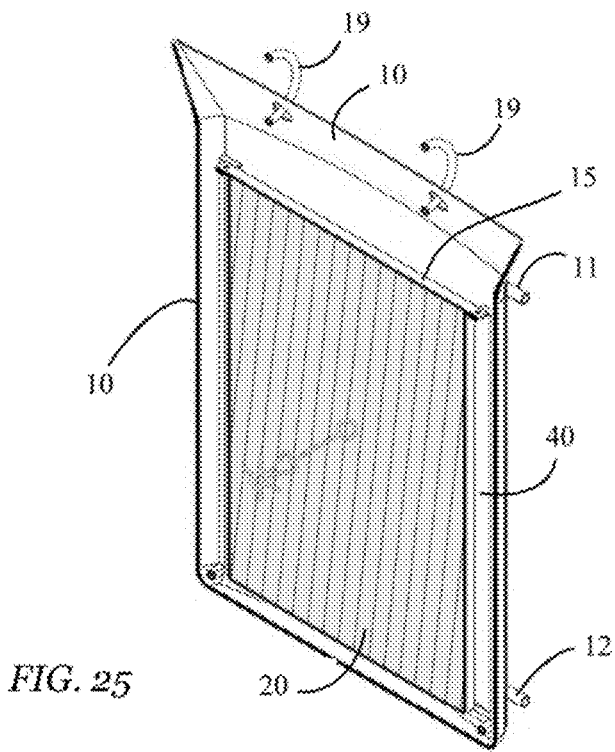
FIG. 25

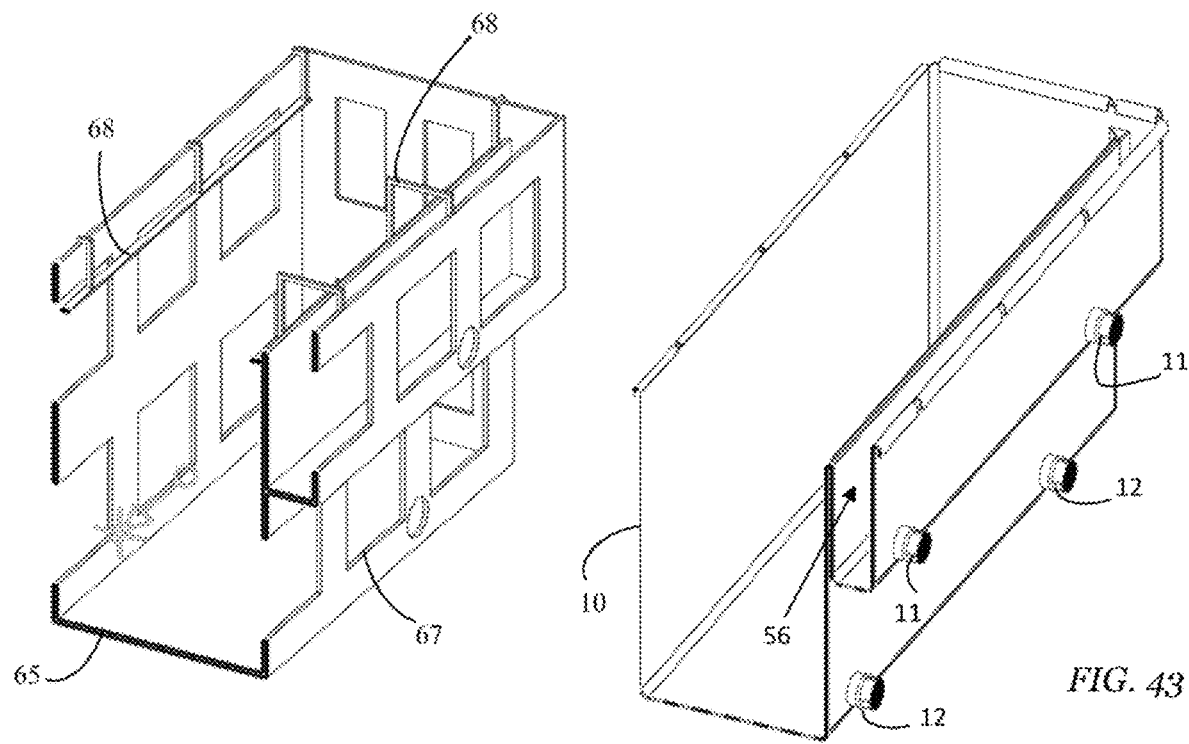
FIG. 42
FIG. 43
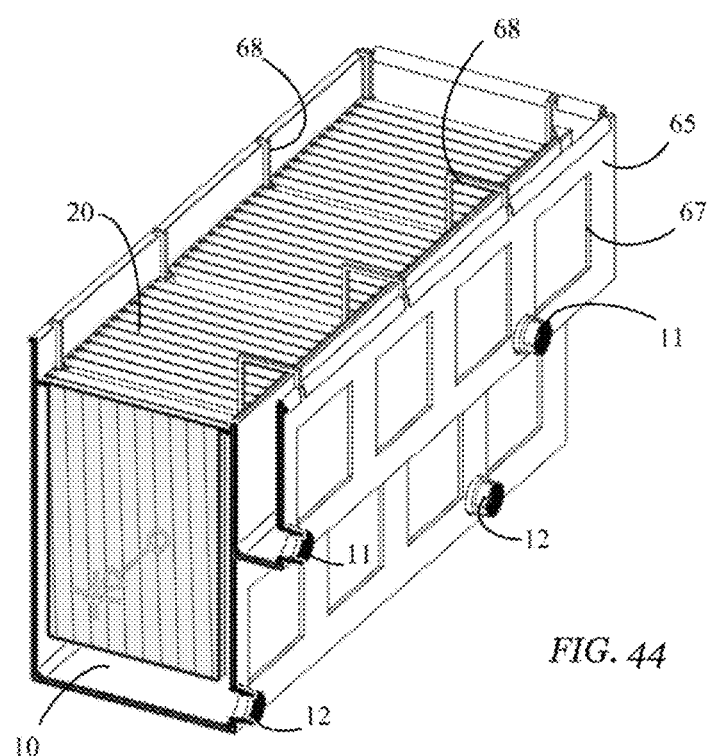
FIG. 44

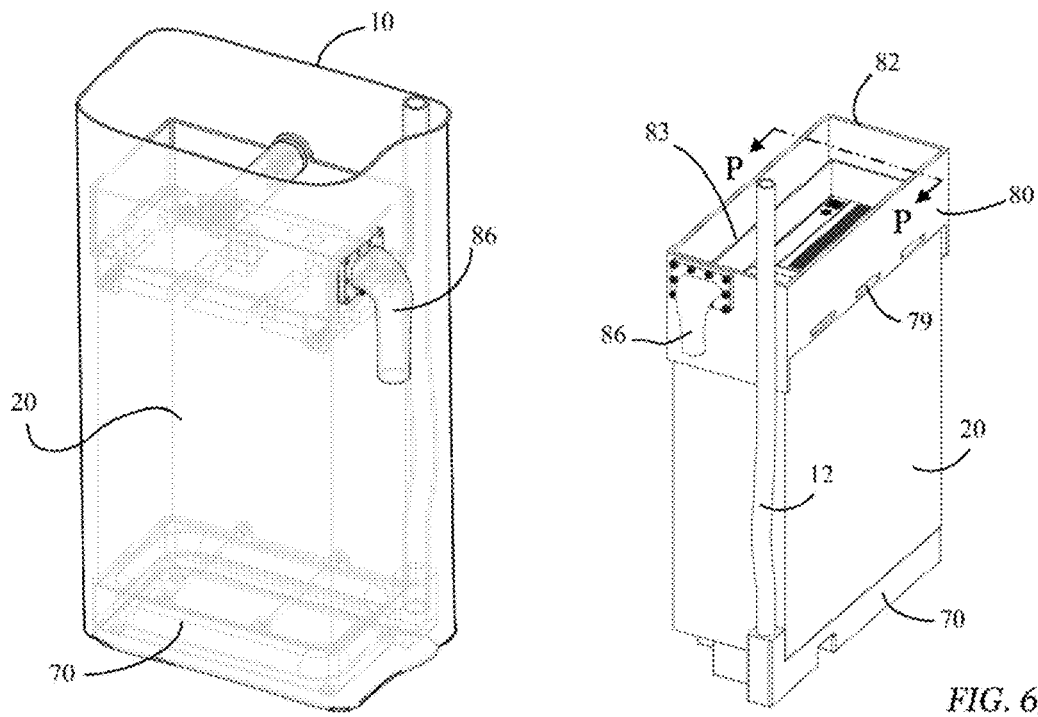
FIG. 64
FIG. 65
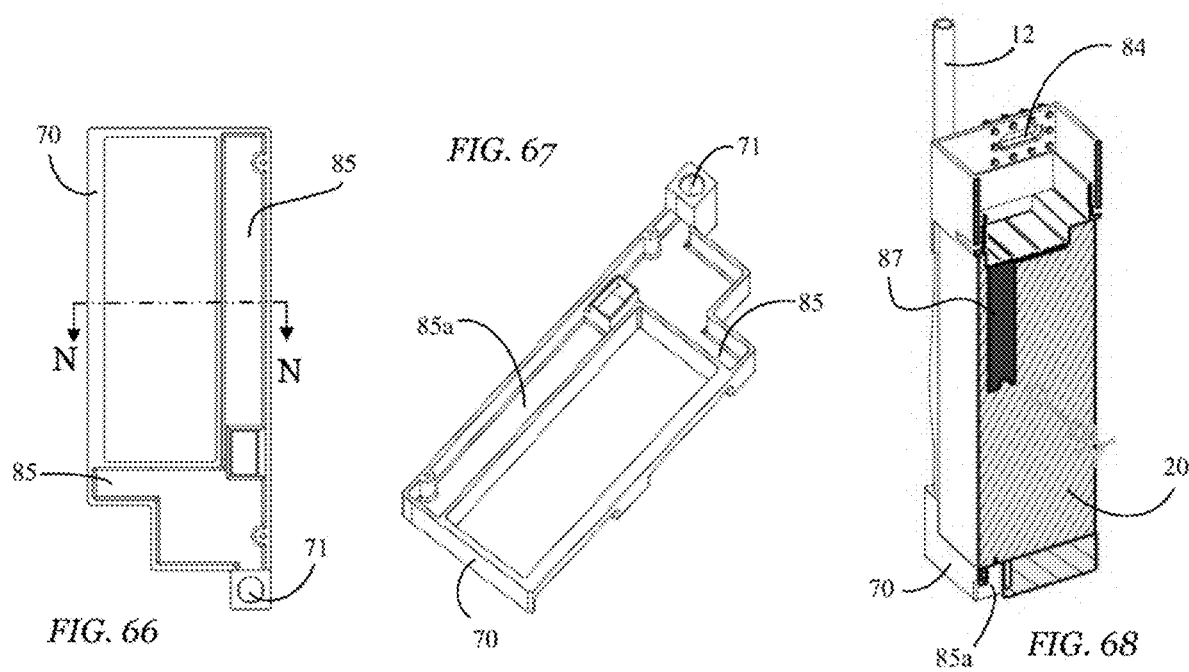
FIG. 66
FIG. 67
FIG. 68

FLEXIBLE MEMBRANE CONTAINER FOR THERMAL MANAGEMENT OF AN ELECTRONIC OBJECT

CROSS-REFERENCE TO RELATED APPLICATIONS

Pursuant to 35 U.S.C. § 119(e), this application claims the benefit of U.S. Provisional Patent Application Ser. No. 63/515,271, filed on Jul. 24, 2023, and claims the benefit of U.S. Provisional Patent Application Ser. No. 63/453,706, filed on Mar. 21, 2023, the entire contents of each of which are incorporated herein by this reference.

BACKGROUND

(1) Field of Endeavor

The present invention relates generally to the field of thermal management of electronic object and components through immersion in dielectric heat transfer fluids ("dielectric coolants"), and more particularly, to the use of flexible membrane materials in the manufacture of containers for the containment of the dielectric coolants and electronic objects for such thermal management.

(2) Description of Related Art

Several past methods exist for employing thermal management to dissipate the heat generated by electronic objects, increase the environmental temperature surrounding electronic objects, or adjust the power consumption or performance of electronic objects. Such electronic objects may be computer servers, batteries, electronic processors, transformers, resistors, capacitors, electric motors, charging systems, lasers, LEDs, and a variety of other high- and low-voltage electronic components and objects. Known thermal management techniques may involve either heating or cooling the electronic object using either a heat management medium such as air, or by using a liquid, either conductive or dielectric in a cold plate or liquid cooled heat sink, or either full or partial immersion of the electronic object in a dielectric coolant.

For example, liquid immersion cooling is often performed by either fully or partially immersing an electronic object to be thermally managed (e.g., cooled, warmed, or insulated) in a container filled with a liquid dielectric coolant. The dielectric coolant is then either mechanically circulated (forced convection) or circulated through natural convection around or through the object in the container to thermally manage the electronic components in or on the target object. Typical liquid dielectric cooling containers have walls, and in some cases lids, and are constructed of rigid materials, such as metal, fiberglass, acrylic (or plexiglass) sheets, or a similar material. The containers are often constructed in configurations that promote only a single physical size of the container and the electronic object. These containers were capable of only a single method of circulating dielectric coolant without the ability to adapt or adjust the volume of dielectric coolant and type of circulation to meet the thermal management demands that are unique or unusual to the electronic object being cooled. Some past containers were designed to provide specific changes in the flow rate or changes in the direction of flow to increase or decrease flow on a particular section(s) of the electronic object. Thus, using a rigid container having circulation and sizing characteristics tailored to containing and thermally regulating a particular electronic object may not provide ideal efficiency when used to thermally regulate another electronic object having a different set of thermal management demands, a different physical size, or flow requirements. Further, rigid containers are not easily adaptable to accommodate electronic equipment of various sizes while maintaining the optimal volume of dielectric coolant. For example, computer servers are available in many different sizes (EIA, OCP, Dual Server Blades, etc.), and an immersion container with rigid walls may be able to, or optimized to, accommodate only one size or standard (EIA or OCP) of a server. Also, the immersion container must be made large enough to accommodate the largest dimension of all potential electronic objects which generally increase the overall size of the container to its least efficient dimensions. Thus, a separately sized immersion container may be needed for each size and configuration of electronic object to maintain reasonable efficiency.

Past containers were generally constructed from metals, composites, plastics, or other materials that are relatively expensive to manufacture, require a large upfront manufacturing investment in molds or dies, or that require certain configurations or construction techniques that can be challenging or labor-intensive and thus difficult to produce in volume and expensive to modify to meet the demands of each specific configuration of a specific object, or a general collection of objects of different characteristics (size and cooling).

The present container seeks to overcome these challenges by providing an easily buildable, adjustable (in size, shape, and volume), customizable, and flexible membrane container for containing both the dielectric coolants and the electronic object to be thermally managed.

SUMMARY

In one embodiment, the flexible membrane container comprises a first flexible membrane, at least one outflow conduit, and at least one inflow conduit. The first flexible membrane defines a first interior volume. The membrane comprises one or more openings for removably receiving into the first interior volume the electronic object for which thermal management is desired. In an embodiment, the membrane generally comprises a single-layer material that exhibits flexible, skin-like properties that are compatible with the materials used in the electronic object and/or the dielectric fluid. In one embodiment, the membrane is a multi-layered membrane, one of which layers comprises a forming layer, such as wire mesh, to promote the flexible membrane container's pre-determined shape.

The electronic object may be connected to an insert frame member. In an embodiment, the insert frame member further comprises a header or housing, which is configured to accommodate electronic connectivity and communication with external components and power sources. The combined electronic object/frame member is inserted into and/or removed from the flexible membrane container via the opening.

In one embodiment, a dielectric coolant is introduced into the flexible membrane container via the inflow conduit. The level of the dielectric coolant rises in the flexible membrane container, passing through a circulation space to immerse the electronic object, thereby enabling heat exchange between the dielectric coolant and the electronic object. When the level of the dielectric coolant reaches the top of an outflow conduit, the dielectric coolant exits the first interior volume and flows into the top of the outflow conduit, then exiting the flexible membrane container.

In applications where the electronic object is relatively small compared to the size of the flexible membrane container, the size of the flexible membrane container can be adjusted by manipulating the membrane to more closely match the shape and size of the electronic object, thereby reducing the first interior volume and the circulation space inside the flexible membrane container. The reduction of the excess volume can be done before or after the electronic object is placed in the flexible membrane container, and during or after the dielectric coolant is placed in the flexible membrane container.

Another embodiment of the membrane comprises multiple layers. One or more flow layers of the membrane may provide for permeation by the dielectric coolant, thereby enabling flow of the dielectric coolant through such permeable flow layer of the membrane. The membrane may further comprise one or more impermeable barrier layers, such as a first barrier layer and a second barrier layer disposed adjacent to a flow layer. In this configuration, a flow layer on a first side of a barrier layer may enable flow, such as outflow, of the dielectric coolant. Alternately, an optional flow layer on a second side of the sane barrier layer may provide opposition flow, such as inflow, of the dielectric coolant.

In another embodiment, the flexible membrane container comprises a support frame to provide rigidity to the flexible membrane container so that it substantially retains its shape when pressurized. The support frame is changeable and adjustable to provide shape-supporting reinforcement to the flexible membrane container, which enables the flexible membrane container to be altered in shape, volume, length, width, and height. The support frame may be disposed inside or outside the first flexible membrane.

In another embodiment, the flexible membrane container comprises one or more thermal exchange plates disposed in thermal communication with the outside of the flexible membrane container to facilitate heat transfer. The plates may comprise a thermally conductive material, such as a metal, to facilitate heat flow. In this embodiment, there may be no flow inside the membrane, such as through the circulation space. Instead, the dielectric coolant is either disposed substantially statically inside the flexible membrane container, or it circulates inside the circulation space by natural convection. In either the static state or the natural convection state, the dielectric coolant exchanges thermal energy with the plates through the membrane. In one alternative of this embodiment, the flexible membrane container does not have a circulation space, and the membrane is placed in direct contact with the electronic object.

In an alternative of this embodiment, the plates may be hollow members that contain heat transfer fluids, such as water or other liquids, gels, or various suitable solutions. These heat transfer fluids may or may not exhibit dielectric properties. In this embodiment, the heat transfer fluid is introduced into the plates via one or more inflow conduits, and the fluid exits from the plates via one or more outflow conduits. This embodiment can implement either an internal or external support frame, as described above, or it can have no support frame.

In one embodiment, the electronic object is seated on a substantially ridged riser or base. The base operates as a flow regulator, such as by agitating, mixing, diffusing, or otherwise managing the flow of the dielectric coolant. For example, one embodiment of the base is substantially rigid and has a substantially rectangular footprint with rounded corners, having an inlet port disposed near one of the corners of the rectangle. The base further comprises a contoured shelf that defines a tapered recess on a top side of the contoured shelf, and defines a contoured channel on a bottom side of the contoured shelf. The channel has smooth contours, such as filleted corners, to promote swirling fluid flow. The electronic object is seated in or on the tapered recess of the base such that the space below the shelf defines a mixing compartment for the dielectric coolant.

Certain applications of the flexible membrane container may be used in connection with an outflow regulator disposed in connection with the electronic object, such as at or near the top of the electronic object. In an embodiment, the outflow regulator comprises a trough defined by an outer wall and an inner wall. In this embodiment, the outer wall is substantially vertical, and the inner wall is disposed at an angle away from the outer wall and toward the center of the electronic object, thereby defining a substantially asymmetric V-shaped cross section. The top of the outer wall is disposed at a higher location than the top of the inner wall.

BRIEF DESCRIPTION OF THE DRAWINGS

FIG. 23 is a perspective view of an embodiment of an flexible membrane container having thermal exchange plates.

FIG. 24 is a side view of the embodiment shown in FIG. 23.

FIG. 25 is cross section F-F.

FIG. 42 is a perspective view of cross section J-J.

FIG. 43 is a perspective view of cross section I-I.

FIG. 44 is a perspective view of cross section H-H.

FIG. 64 is a perspective view of one embodiment of a bitcoin miner disposed inside a flexible membrane.

FIG. 65 is a perspective view of a server disposed on a base and having an outflow regulator.

FIG. 66 is a top view of a base adapted for use with a server inside a flexible membrane container.

FIG. 67 is a perspective view of a base adapted for use with a server inside a flexible membrane container.

FIG. 68 is a perspective view showing cross section N-N through a server on a base and having an outflow regulator.

DESCRIPTION OF THE PREFERRED EMBODIMENT

With reference to the drawings, the flexible membrane container for thermal management of electronic objects will now be described with regard for the best mode and the preferred embodiments. In general, the device is a customizable, flexible membrane container for retaining a dielectric coolant and one or more electronic objects to be thermally managed. The embodiments disclosed herein are meant for illustration and not for limitation of the invention. An ordinary practitioner will appreciate that it is possible to create many variations of the following embodiments without undue experimentation by varying such factors as width, length, height, inserts, framework, number of devices to be contained, open and sealed connections, etc. Unless otherwise specified herein, references to length refer to dimensions along the L axis shown in FIG. 1, references to width refer to dimensions along the W axis, and references to height refer to dimensions along the H axis.

As discussed herein, the term thermal management and related terms means maintaining, controlling, regulating, insulating, or adjusting the temperature of the subject electronic object 20. As set forth above, the term dielectric coolant means a dielectric heat transfer fluid used for thermal management of an electronic object 20. The electronic object 20 may be a computer server or group of servers, a battery or bank of batteries, or one or more electronic processors, transformers, capacitors, electric motors, electric circuit boards, or a combination of the former objects, as well as a variety of other high- and low-voltage electronic components or objects. Thermal management may include cooling of the electronic object 20, for example, the cooling of computer servers engaged in general compute, cloud services, etc. Another form of thermal management may include heating of the electronic object 20, for example, the heating of batteries that are operating in very cold (e.g., sub-zero) conditions. Another form of thermal management may include simply maintaining the temperature of the electronic object 20, at a preferred temperature, for example, the maintenance of a laser to its preferred operating temperature to eliminate temperature-related frequency variation. An ordinary practitioner will appreciate a wide range of other circumstances and scenarios where thermal management of an electronic object 20 will promote efficient or desirable operation of the electronic object 20, and may even be required to enable any operation at all of the electronic object 20.

The term flexible in relation to the membrane means that the membrane has fabric-like or rubber-like bendability, such as the sides of a plastic bag or the rubber walls of a hot water bottle. Although panels of containers composed of materials such as sheet metal or fiberglass exhibit some level of bendability, such rigid materials are outside the scope of the meaning of a "flexible" membrane as contemplated by the present discussion.

Figure 1:
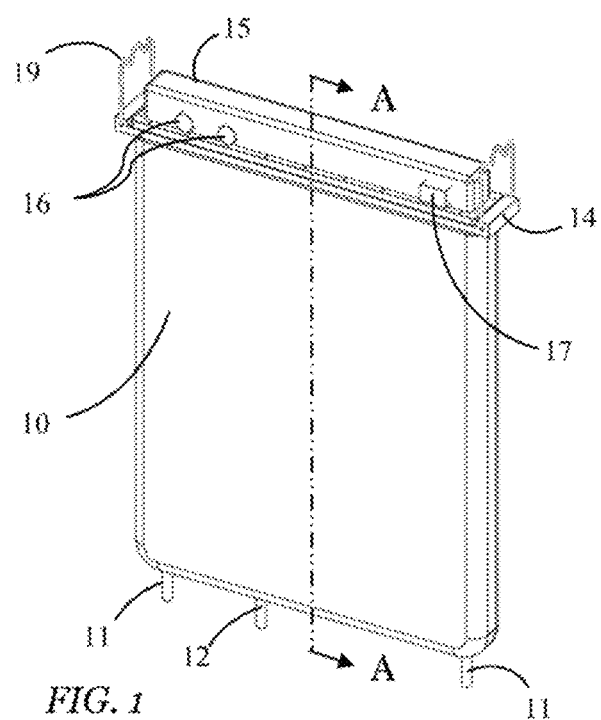
FIG. 1 is a perspective view of one embodiment of an flexible membrane container having an electronic object inserted therein.
Figure 2:
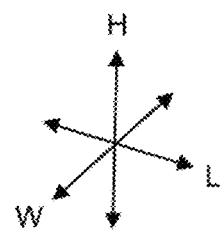
FIG. 2 is a perspective view of one embodiment of a membrane for the flexible membrane container shown in FIG. 1.
Figure 2:
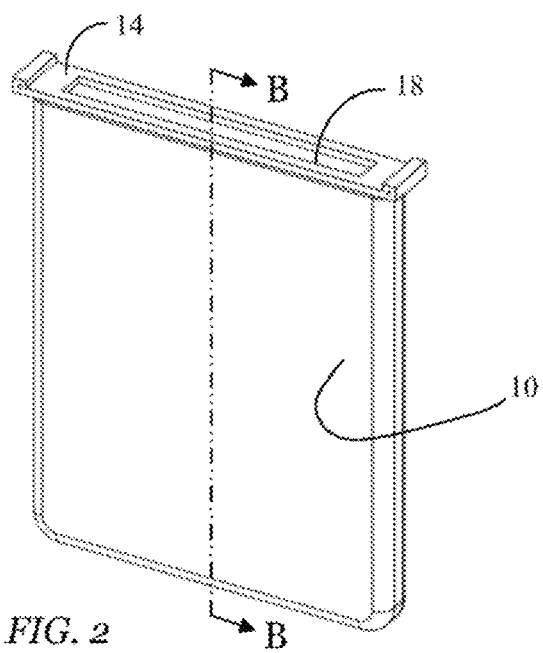
Figure 3:
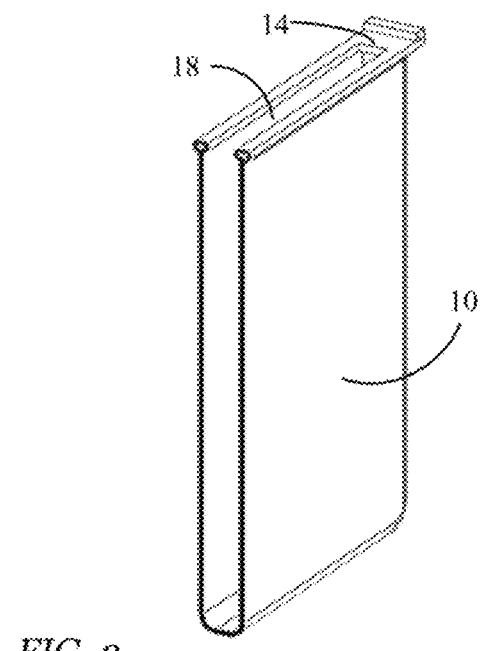
FIG. 3 is a perspective view showing cross section B-B of the membrane depicted in FIG. 2.

Referring to FIG. 1, in one embodiment the flexible membrane container 1 comprises a first flexible membrane 10, at least one outflow conduit 11, and at least one inflow conduit 12. The first flexible membrane 10 defines a first interior volume. As shown in FIGS. 2 and 3, the membrane 10 comprises one or more openings 18 for removably receiving into the first interior volume the electronic object 20 for which thermal management is desired. In an alternative to this embodiment, the electronic object 20 is placed within and fully sealed inside the flexible membrane container 1 at the manufacturing stage, which results in a seal that is not intended for removal of the electronic object 20 from the flexible membrane container 1. The flexible membrane container 1 may be designed for accommodation specific electronic object 20, or it may take the form of a generic flexible membrane container 1 that can hold one or more electronic objects 20 of the same or different types, sizes, characteristics, and functions.

The membrane 10 generally comprises a material that exhibits flexible skin-like properties that are compatible with the materials used in the object and/or the dielectric fluid, and may be conductive, semi conductive, or non-conductive to electricity, light, heat, wireless frequencies, and other forms of energy. For example, it may be advantageous for the membrane 10 to embody properties that include antistatic, waterproof, fuel proof, non-explosive, grounding, non- or low-combustibility, resistance to ripping, tearing, or puncturing, flexibility for expansion, elasticity for constriction, or other membrane properties, as would be appreciated by an ordinary practitioner. Exemplary materials include polyester, polyethylene, polyethylene terephthalate (PET), HDPE, LDPE, nylon, polypropylene, PVC, vinyl, polyurethane, silicone, and metallocene, or such other thin flexible materials which exhibit the necessary properties required for the containment and thermal management of the electronic object.

In another embodiment, the membrane 10 comprises a pre-formed shape, such as a generally rectangular shape (shown in FIGS. 1 and 2), a cylindrical shape, or some other shape. In this embodiment, the membrane 10 may be a pre-formed, pre-shaped material, preferably embodying the specifications, characteristics, and/or materials listed above. In another embodiment, the membrane 10 is a multi-layered membrane 10, one of which layers comprises a forming layer to promote the flexible membrane container's 1 predetermined shape. Examples of such forming layers are a wire or plastic mesh, metal frame or mesh, or other wires, strands, hoops, bands, fabrics, or similar members that are capable of providing structural, form-promoting support, strength, and/or elasticity to the membrane 10.

In a further embodiment intended for hanging, shown in FIGS. 1 and 4-8, the flexible membrane container 1 comprises a frame member 14 that connects to support members (not shown) such as hooks, rods, anchors, or the like. Such frame member 14 may be a collar configured to connect to one or more connectors 19, such as hooks, clamps, rings, or the like from which the flexible membrane container 1 is hung. The frame member 14 also provides structural support for suspending the electronic object 20 inside the flexible membrane container 1, as described below.

Figure 4:
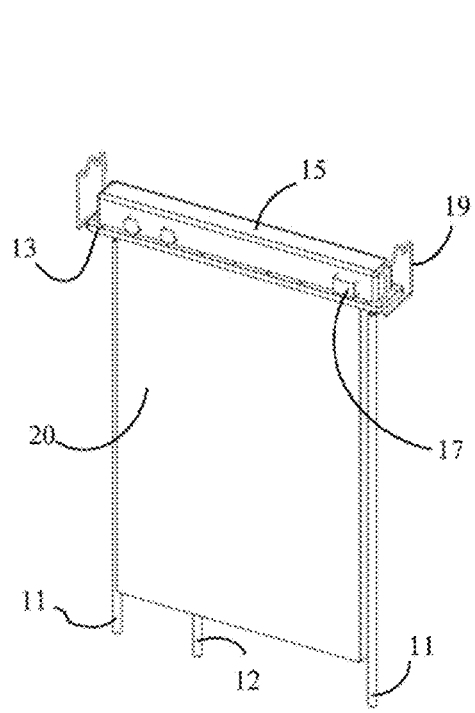
FIG. 4 is a perspective view of one embodiment of an electronic object for insertion into the flexible membrane container shown in FIG. 1.

Referring to FIG. 4, an electronic object 20 is connected to an insert frame member 13. In an embodiment, the insert frame member 13 further comprises a header 15 or housing, which is configured to accommodate the insertion and removal of dielectric coolant, electronic connectivity, and communication with external components and power sources. For example, in one embodiment the header 15 comprises one or more ports 16 for receiving cables, such as power cables or data communication cables (e.g., Ethernet cables). The header 15 further comprises one or more controls 17, such as on/off switches, temperature indicators, or the like.

Figure 5:
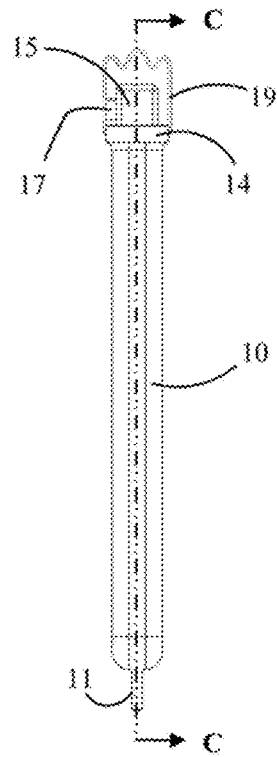
FIG. 5 is a side view of the embodiment of the flexible membrane container shown in FIG. 1.
Figure 6:
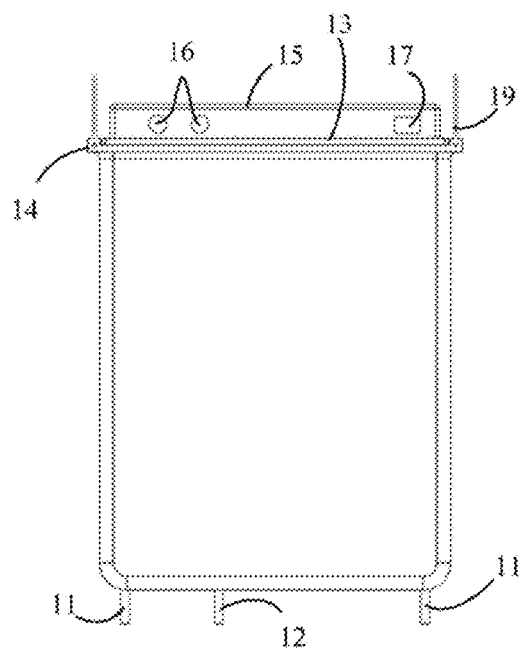
FIG. 6 is a front view of the flexible membrane container shown in FIG. 1.
Figure 7:
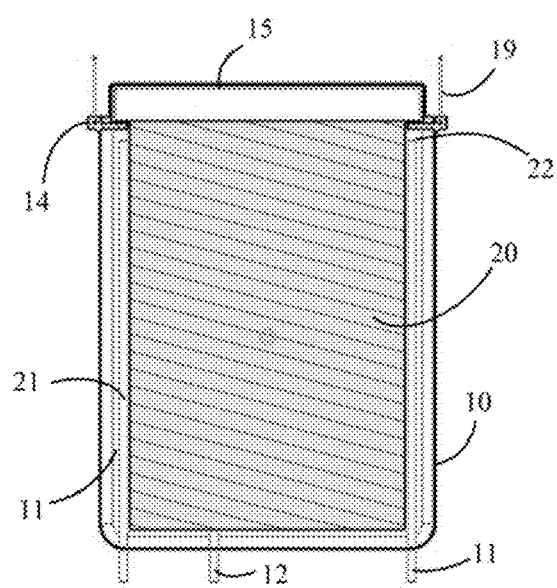
FIG. 7 is cross section C-C.
Figure 8:
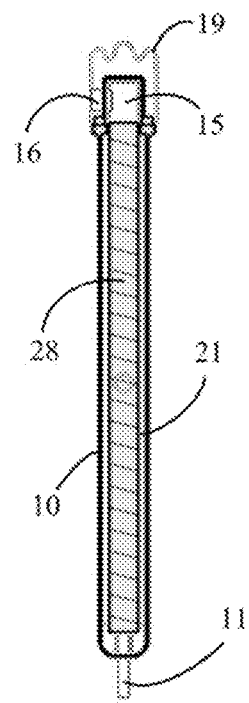
FIG. 8 is cross section A-A.
Figure 9:
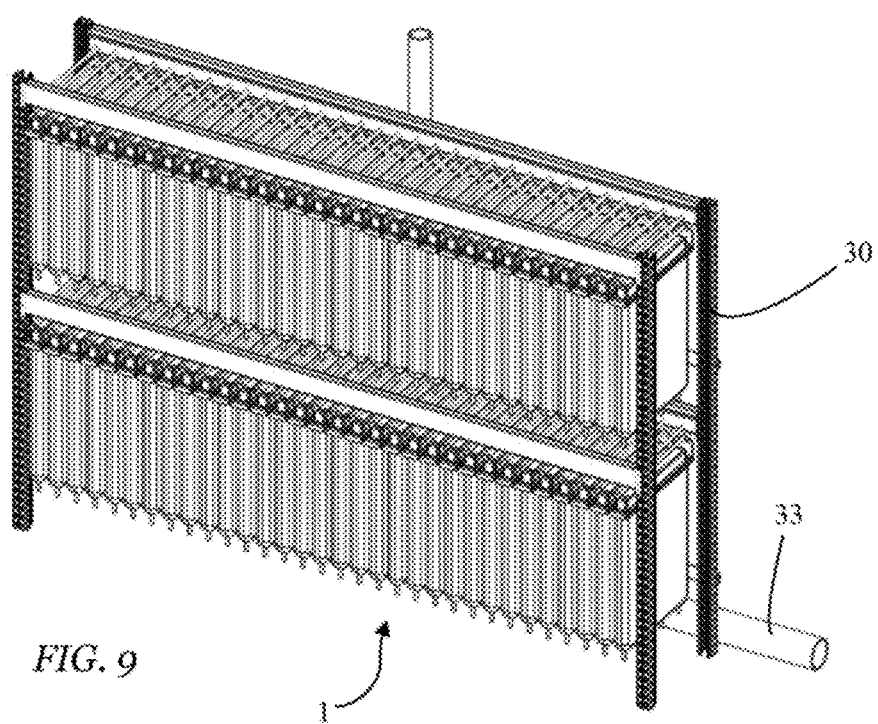
FIG. 9 is a front perspective view of one embodiment of an array of flexible membrane containers for thermal management of computer servers in a data center.
Figure 10:
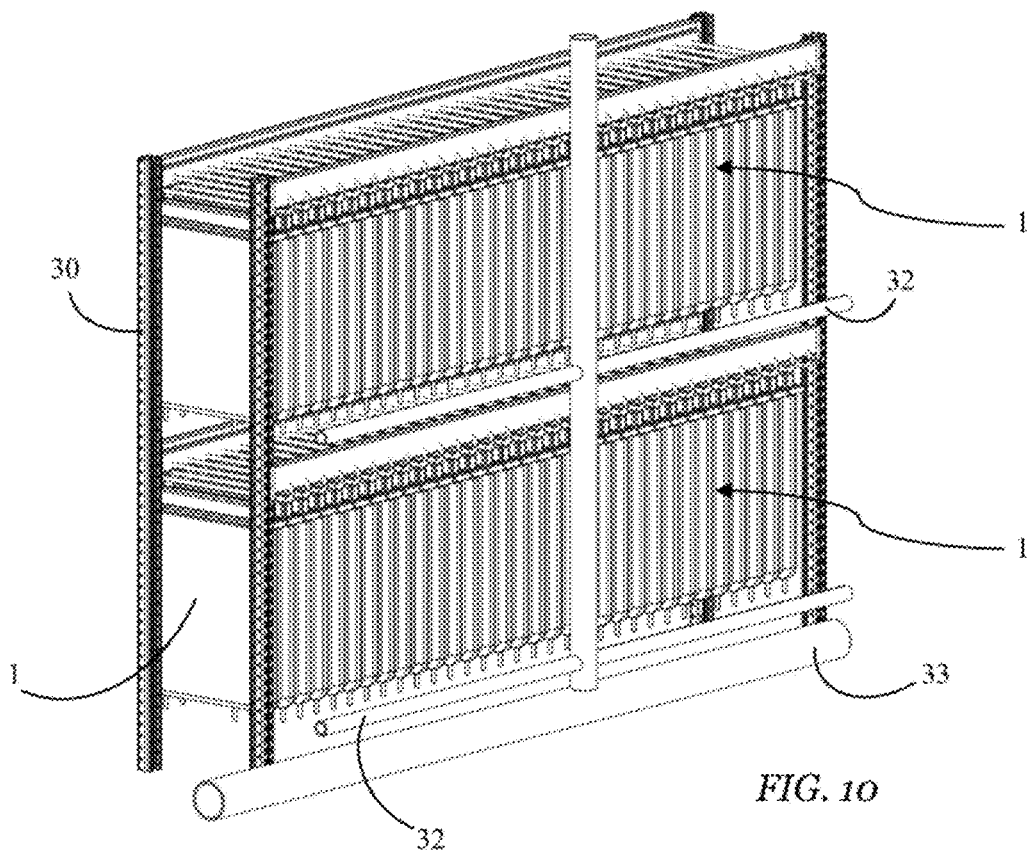
FIG. 10 is a rear perspective view of one embodiment of an array of flexible membrane containers for thermal management of computer servers in a data center.
Figure 11:
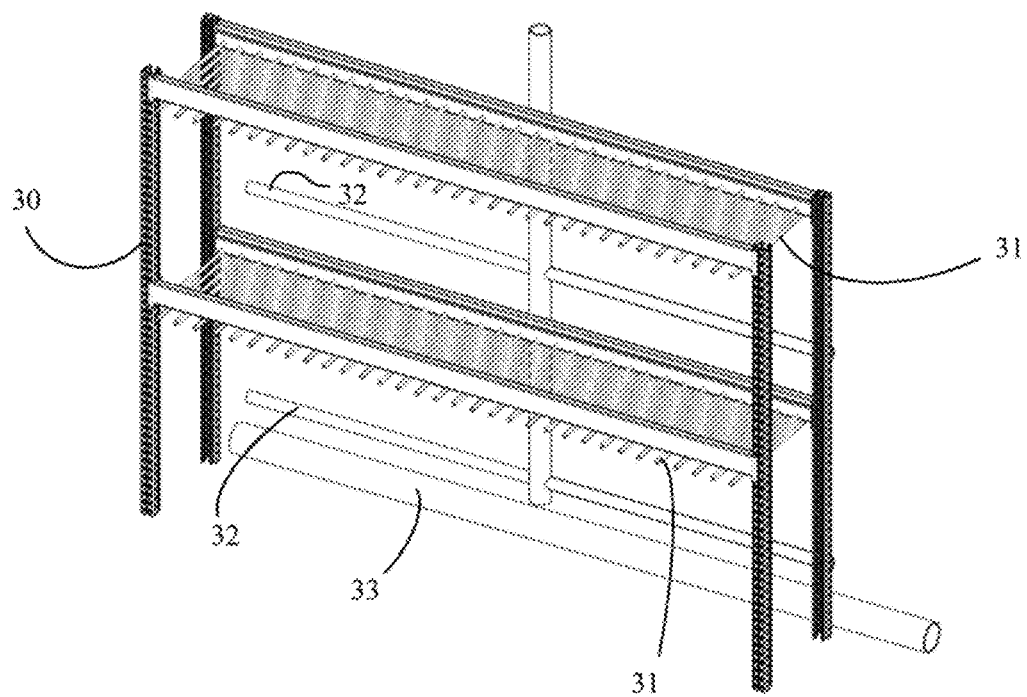
FIG. 11 is a front perspective view of one embodiment of the frame shown in FIGS. 9 and 10.

The combined electronic object 20/frame member 13 is inserted into the flexible membrane container 1 via the opening 18 shown in FIG. 2, resulting in the configuration shown in FIGS. 1, 5, and 6. In one embodiment, shown in FIGS. 7 and 8, the flexible membrane container 1 accommodates a circulation space 21 between the membrane 10 and the electronic object 20. The circulation space 21 enables the circulation of dielectric coolant (not shown) between the membrane 10 and the electronic object 20, thus enabling heat exchange between the electronic object 20 and the dielectric coolant, thereby promoting thermal management.

In one embodiment, once these components are assembled, a dielectric coolant is introduced into the flexible membrane container 1 via the inflow conduit 12. The level of the dielectric coolant rises in the flexible membrane container 1, passing through the circulation space 21 to immerse the electronic object 20, thereby enabling heat exchange between the dielectric coolant and the electronic object 20. When the level of the dielectric coolant reaches the top 22 of the outflow conduit 11, the dielectric coolant flows into the top 22 of the outflow conduit 11 and exits the flexible membrane container 1.

In embodiments with two or more outflow conduits 11, the outflow conduits 11 may have tops 22 at different heights for fail-safe overflow. For example, a first outflow conduit 11 may have a top 22 at height $H_1$ and a second outflow conduit 11 may have a height $H_2$, where $H_2$ is higher than $H_1$. In normal operation, the first outflow conduit 11 may be the primary and only outflow conduit if it can sufficiently accommodate the volume of outflow of the dielectric coolant. However, if the first outflow conduit 11 becomes blocked or otherwise becomes inoperable, the level of dielectric coolant in the flexible membrane container 1 continues to rise until it reaches height $H_2$. The dielectric coolant then flows into the second outflow conduit 11, which serves as an overflow conduit for the flexible membrane container 1.

In applications where the electronic object 20 is relatively small compared to the size of the flexible membrane container 1, the size of the flexible membrane container 1 can be adjusted by manipulating the membrane to more closely match the shape and size of the electronic object 20, thereby reducing the first interior volume and the circulation space 21 inside the flexible membrane container 1. For example, where the length of the electronic object 1 is relatively short compared to the length of the flexible membrane container 1, the sides of the flexible membrane container 1 are shortened by folding, clamping, cinching, crimping, rolling, or otherwise collapsing the membrane 10 to reduce the amount of volume of the flexible membrane container 1. As another example, where the height of the electronic object 20 is relatively large compared to the height of the flexible membrane container 1, the flexible membrane container can be shortened by the same or similar methods, e.g., folding, clamping, cinching, crimping, rolling, or otherwise collapsing the bottom portion of the membrane 10. As another volume-reducing alternative, the bottom of the membrane 10 could be rolled up, starting at the bottom of the membrane 10, to better match the height of the electronic object 20. The reduction of the excess volume can be done before or after the electronic object 20 is placed in the flexible membrane container 1, and during or after the dielectric coolant is placed in the flexible membrane container 1.

Multiple flexible membrane containers 1 can be used in a systematic way for thermal management of multiple electronic objects 20. Referring to FIGS. 9-13, for example, in one embodiment multiple flexible membrane containers 1 as described above are used for thermal management of computer servers in a data center. In this exemplary embodiment, each flexible membrane container 1 contains one or more computer servers, and each flexible membrane container 1 is suspended from a frame 30. The frame 30 comprises one or more supports 31 for engaging the hangers 19 on each flexible membrane container 1 to suspend each flexible membrane container 1 on the frame 30. The frame 30 further comprises a main inflow conduit 32 and a main outflow conduit 33. The main inflow conduit 32 is disposed in fluid communication with the inflow conduit 12 on each flexible membrane container 1, and the main outflow conduit 33 is disposed in fluid communication with each outflow conduit 11 on each flexible membrane container 1.

The computer servers are assembled to the housing 15 and inserted into the flexible membrane container 1 as described above. Each flexible membrane container 1 is then connected to the frame 30 by suspending the flexible membrane container 1 from the supports 31 via the hangers 19. Each inflow conduit 12 on each suspended flexible membrane container 1 is then disposed in fluid communication with the main inflow conduit 32. Each outflow conduit 11 on each suspended flexible membrane container 1 is then disposed in fluid communication with the main outflow conduit 33. The dielectric coolant then flows through the main inflow conduit 32, into each inflow conduit 12, and into each flexible membrane container 1. Once the level of the dielectric coolant reaches the top 22 of the outflow conduits 11 as described above, the dielectric coolant enters the top 22 of each such outflow conduit 11, and flows into the main outflow conduit 33 to exit the system. Accordingly, the frame 30 accommodates an array of flexible membrane containers 1 for thermal management of computer servers in a data center.

In another embodiment of the membrane 10, shown in FIG. 14, the membrane 10 comprises multiple layers. One or more forming layers may provide shape to the membrane 10 (and therefore the flexible membrane container 1) as described above. Alternately, one or more flow layers 35 of the membrane 10 may provide for permeation by the dielectric coolant, thereby enabling flow of the dielectric coolant through such permeable flow layer 35 of the membrane 10. The permeable flow layer 35 may comprise a variety of woven or non-woven materials or fabrics the permit flow of the dielectric coolant. The membrane 10 may further comprise one or more impermeable barrier layers 36, such as a first barrier layer 36a and a second barrier layer 36b disposed adjacent to a flow layer 35. In this configuration, a flow layer 35 on a first side of a barrier layer 36 may enable flow, such as outflow, of the dielectric coolant. Alternately, an optional flow layer 35 on a second side of the sane barrier layer 36 may provide opposition flow, such as inflow, of the dielectric coolant.

Figure 14A:
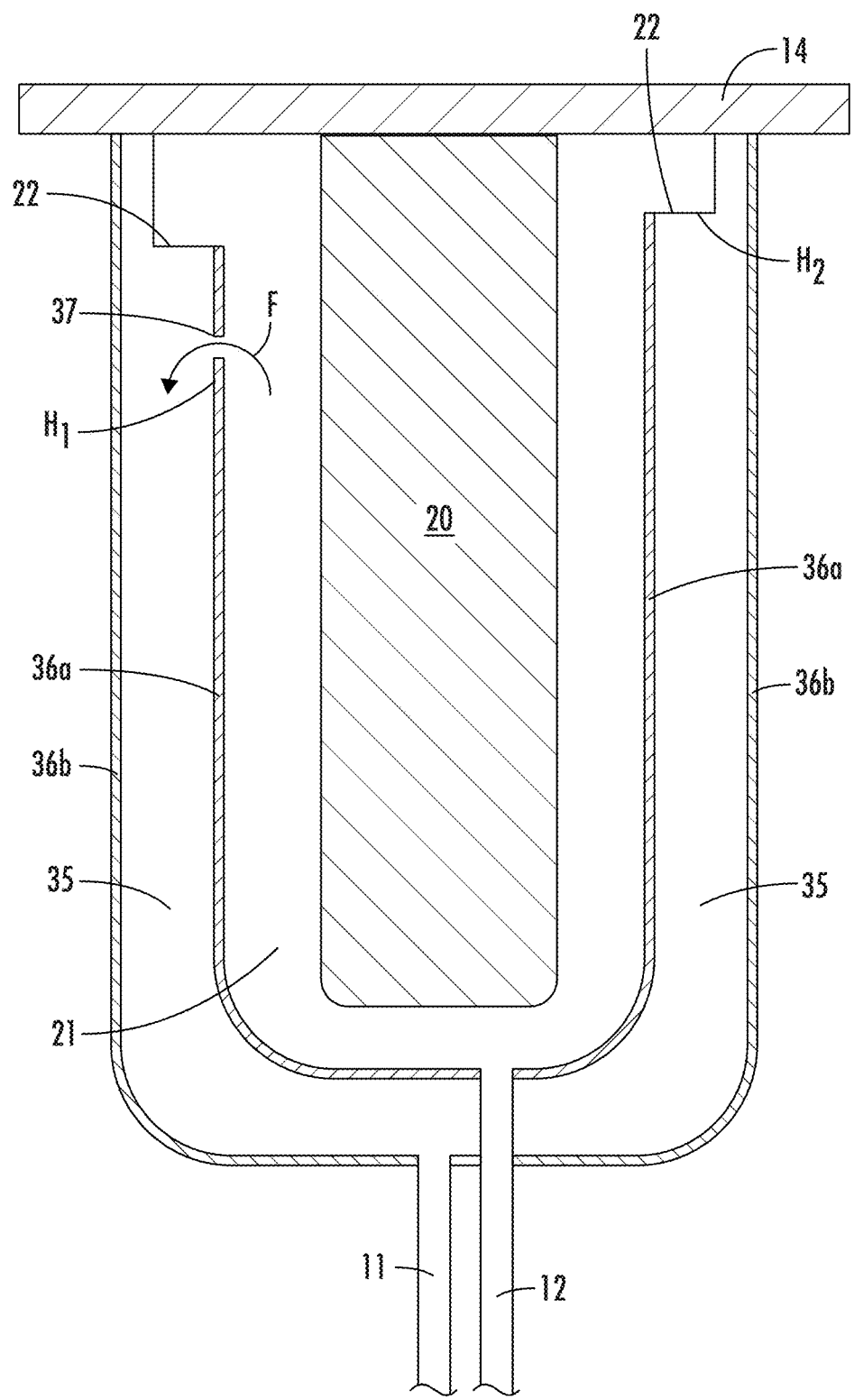
FIG. 14A is a cross section of one embodiment of a multi-layered flexible membrane container showing a first barrier layer with an exit port.
Figure 14B:
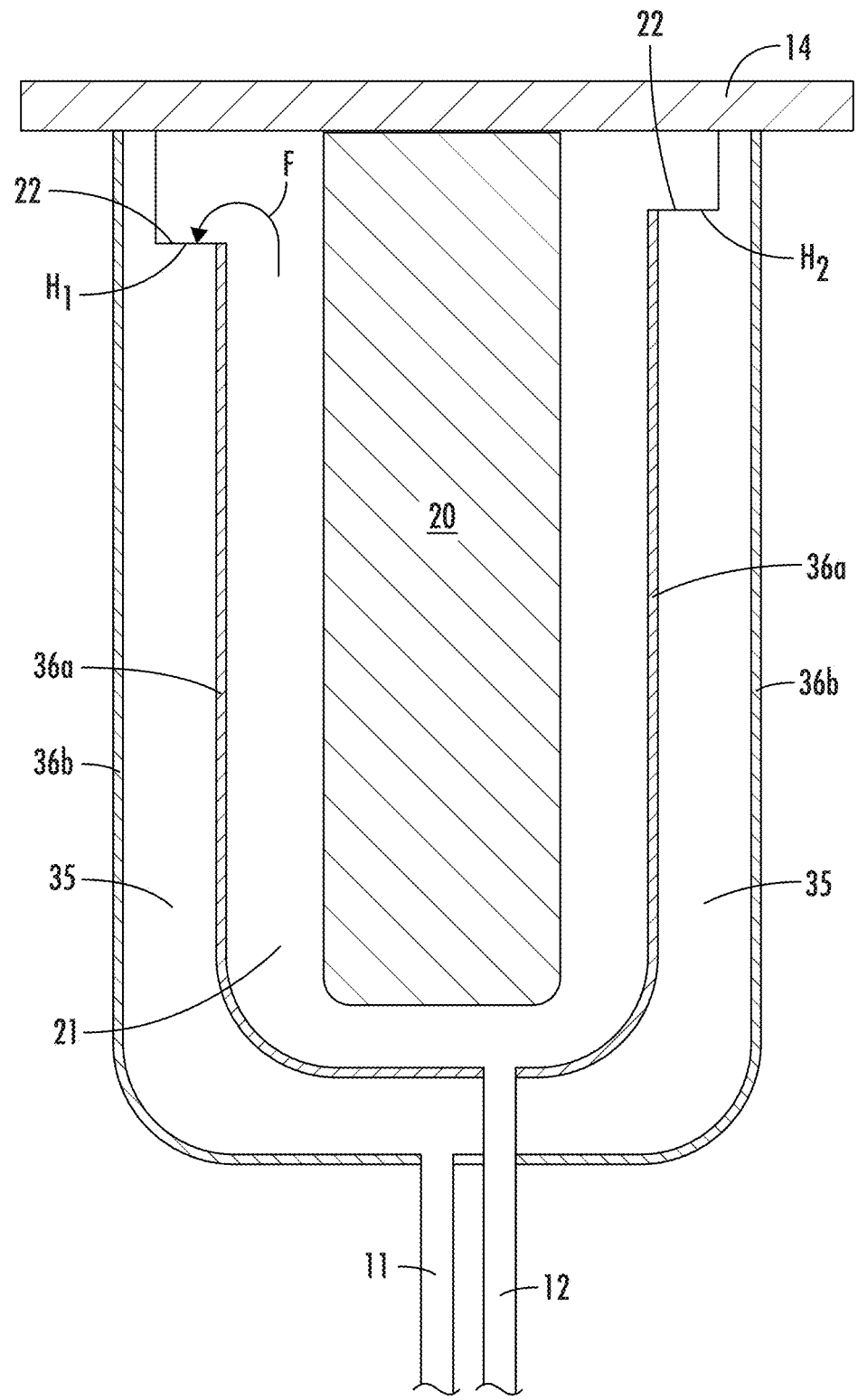
FIG. 14B is a cross section of one embodiment of a multi-layered flexible membrane container.
Figure 15:
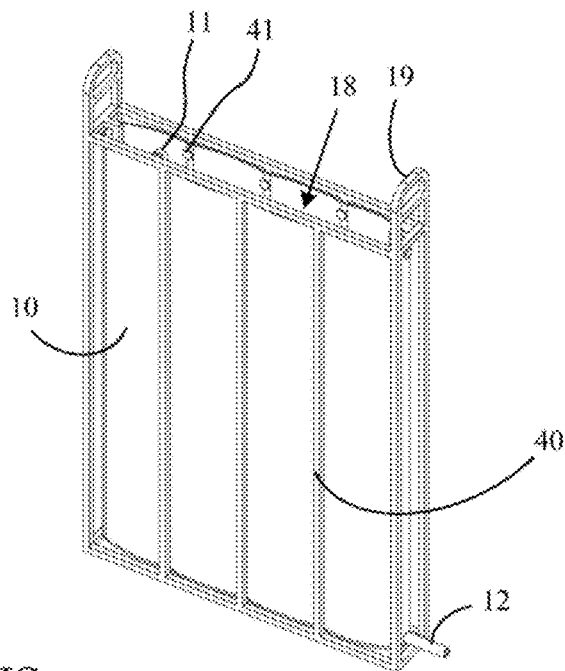
FIG. 15 is a perspective view of an embodiment of an flexible membrane container having an external support frame.
Figure 16:
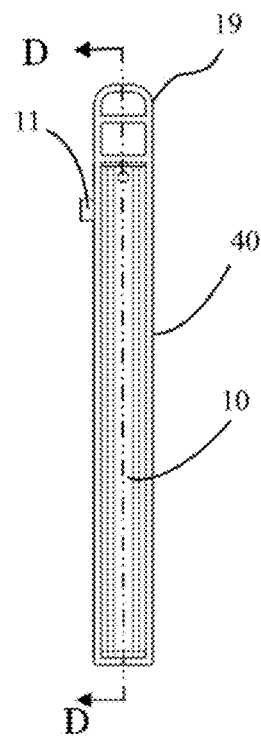
FIG. 16 is a side view of the embodiment shown in FIG. 15.
Figure 17:
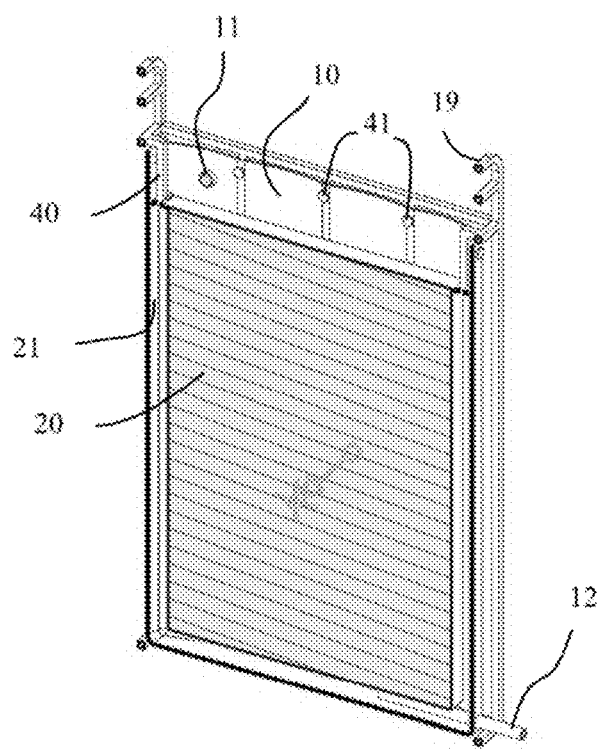
FIG. 17 is cross section D-D.
Figure 18:
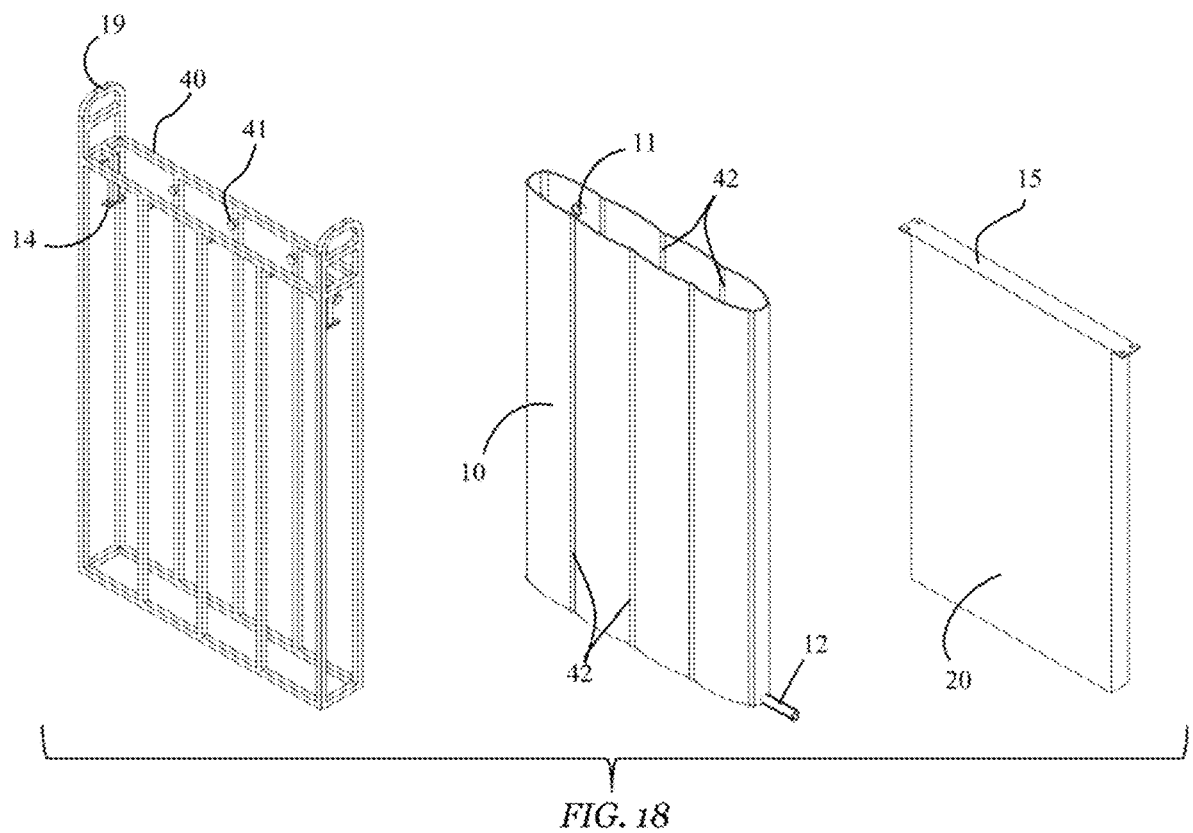
FIG. 18 is an exploded view of the embodiment shown in FIG. 15.
Figure 19:
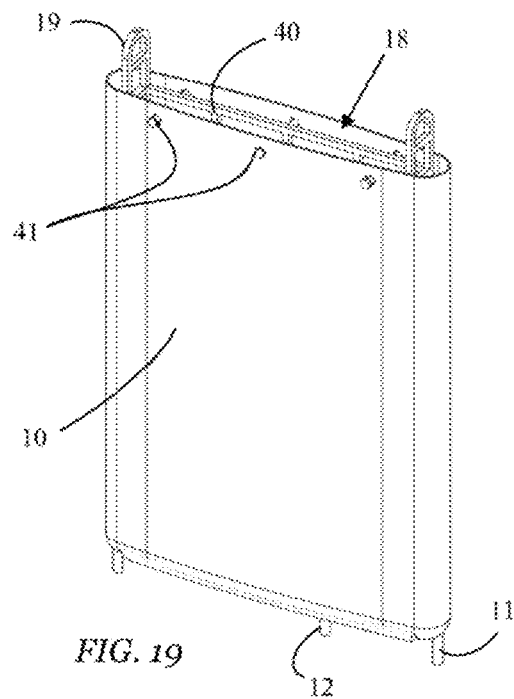
FIG. 19 is a perspective view of an embodiment of an flexible membrane container having an internal support frame.
Figure 20:
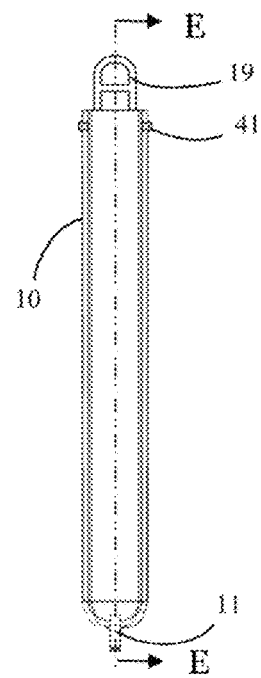
FIG. 20 is a side view of the embodiment shown in FIG. 19.
Figure 21:
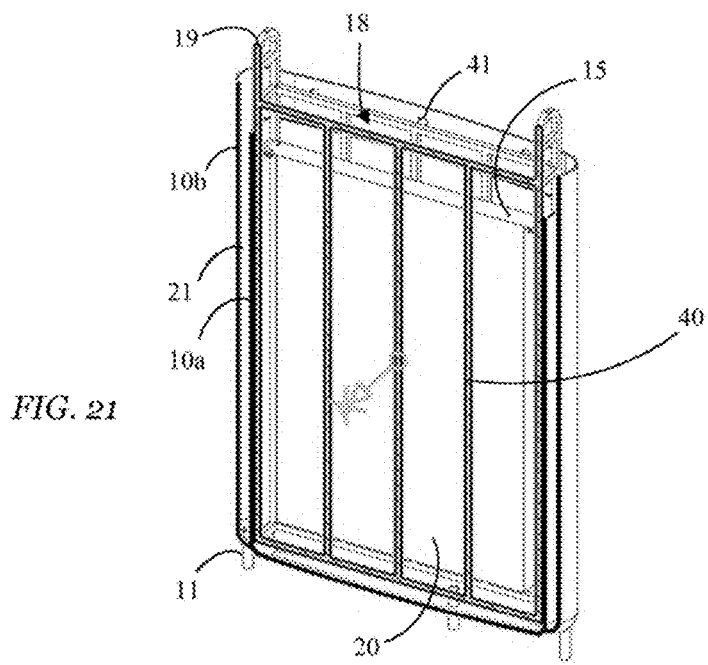
FIG. 21 is a perspective view of cross section E-E.
Figure 22:
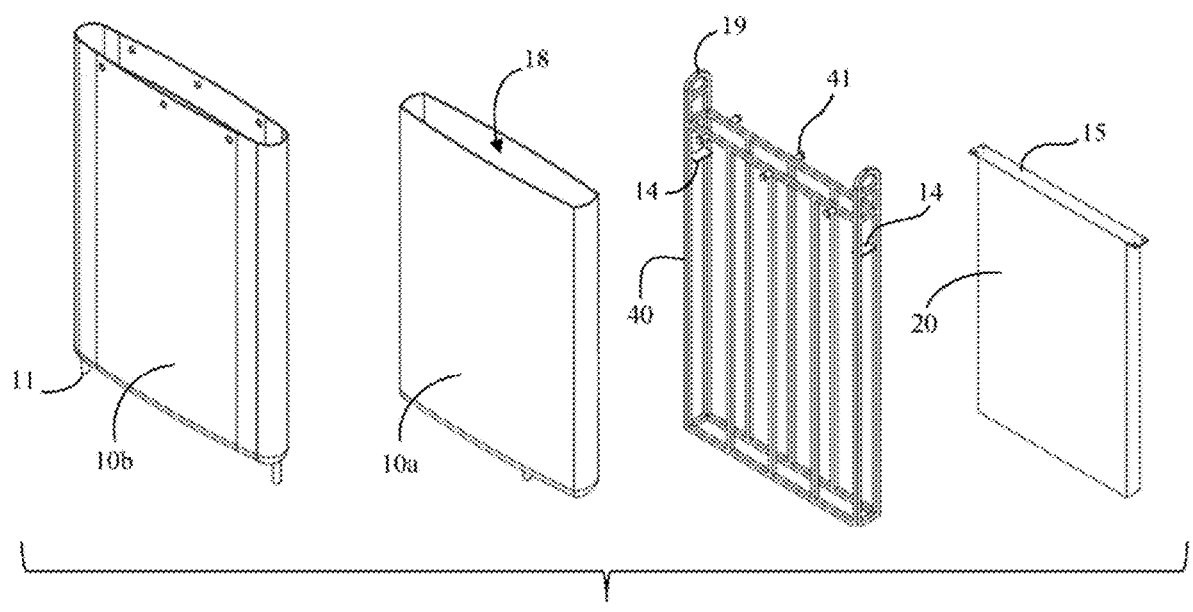
FIG. 22 is an exploded view of the embodiment shown in FIG. 19.
Figure 26:
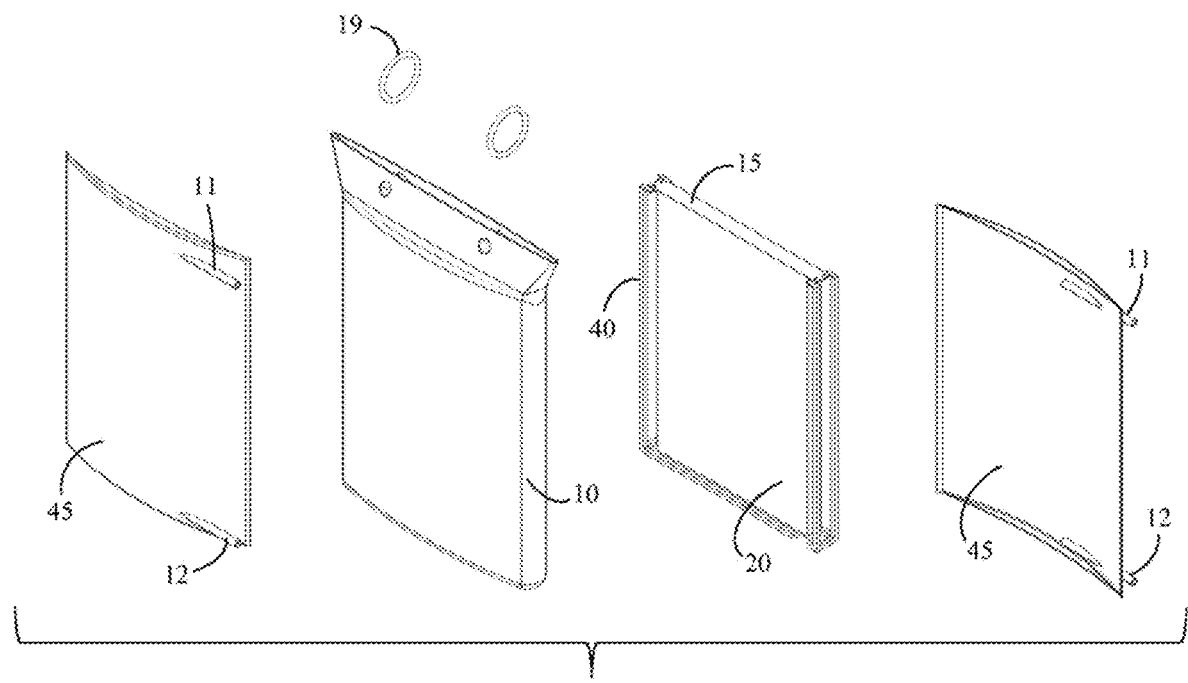
FIG. 26 is an exploded view of the embodiment shown in FIG. 23.
Figure 27:
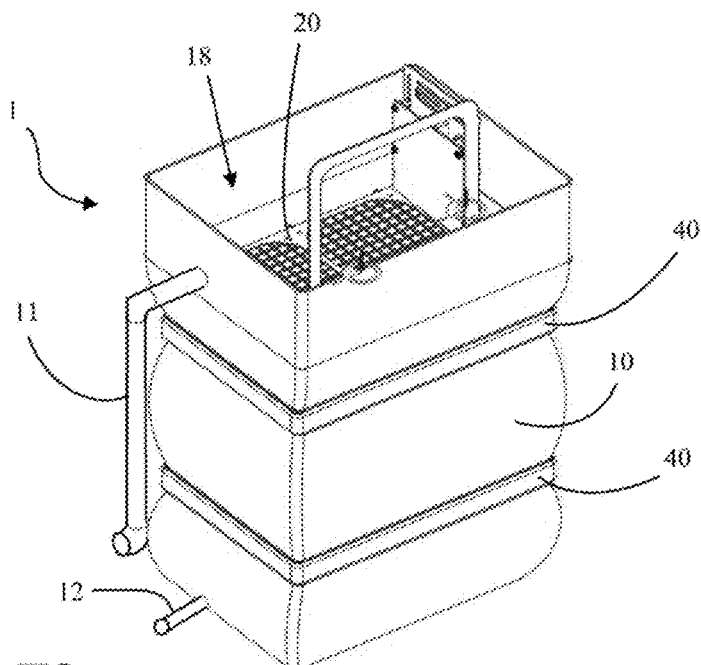
FIG. 27 is a perspective view of an embodiment of an flexible membrane container for thermal management of a bitcoin miner.
Figure 28:
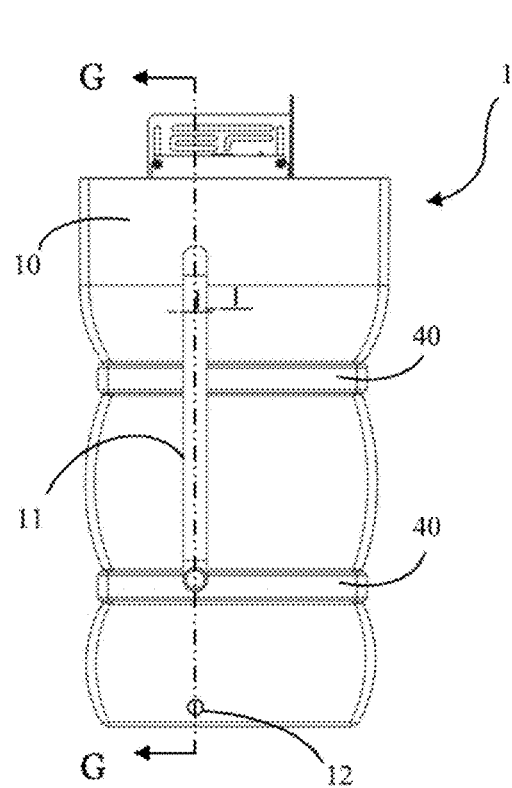
FIG. 28 is a side view of the embodiment shown in FIG. 27.
Figure 29:
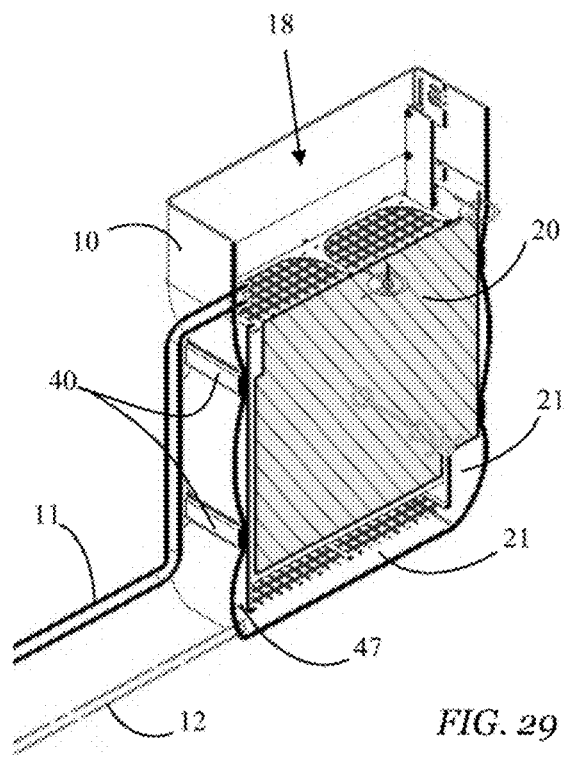
FIG. 29 is cross section G-G.

As one example, in FIGS. 14A and 14B the dielectric coolant flows into the inflow conduit 12 and into the circulation space 21. The dielectric coolant is retained between the electronic object 20 and a first barrier layer 36a. As shown in embodiment depicted in FIG. 14A, the first barrier layer 36a comprises one or more exit ports 37 that enable the dielectric coolant to exit the circulation space 21 and enter into the flow layer 35. The exit port 37 may be a hole, a slot, or an aperture located at a height which is intended for the surface level of dielectric coolant in the first interior volume. Alternatively, as shown in FIG. 14B, the first barrier layer 36a may comprise a top rim or lip that permits spillover into the flow layer 35. For example, the level of dielectric coolant rises in the flexible membrane container 1 until it reaches the top 22 (designated as $H_1$ in FIG. 14B) of the flow layer 35. Under that condition, the dielectric coolant spills over the top edge of the first barrier layer 36a, thereby exiting the first interior volume and flowing into the flow layer 35, as indicated by arrow F in FIG. 14B. The dielectric coolant then flows through the flow layer 35 to the outflow conduit 11, where it exits the flexible membrane container 1. In one embodiment, a second portion of the first barrier layer 36a has a top rim, edge, or lip that may rise to an elevation of $H_2$, where $H_2$ is located at a higher elevation than $H_1$. In this embodiment, $H_2$ functions as an overflow conduit as described above.

In another embodiment, the flexible membrane container 1 comprises a support frame 40, which is a structural component that provides rigidity or structure to the flexible membrane container 1 so that it substantially retains its shape when pressurized. The support frame 40 could include one or more of a cage, wire mesh, bands, straps, bars, rods, panels, plates, or the like. The support frame 40 is changeable and adjustable to provide shape-supporting reinforcement to the flexible membrane container 1. This enables the flexible membrane container 1 to be altered in shape, volume, length, width, and height. For example, referring to FIGS. 15-18, in one embodiment the flexible membrane container 1 is disposed inside the support frame 40. Preferably, the membrane 10 is connected to the support frame 40 by one or more connectors 41. The membrane 10 may have one or more reinforced areas 42 that provide durability and strength to the membrane 10. The reinforced area 42 may be a strip, patch, swatch, or other similar material that is attached to, or integrated within, the membrane 10. The reinforced area 42 may comprise a multi-ply patch or integrated strip or rod comprising metal, carbon fiber, plastic, or other suitable material. The electronic object 20 may be attached to a header 15, which attaches to a frame 14 connected to the support frame 40. The hanger 19 may be connected directly to, or integral with, the support frame 40.

In another embodiment, shown in FIGS. 19-22, the support frame 40 is disposed inside at least one layer of the membrane 10. In this embodiment, the membrane 10 comprises a first membrane 10a and a second membrane 10b. The support frame 40 may be disposed inside one of the first membrane 10a or the second membrane 10b, or it may be disposed outside both of the first and second membranes 10a, 10b. The frame 40 is shown inside the first membrane 10a in FIG. 21. The electronic object 20 may be attached to a header 15, which is attached to a frame 14 connected to the support frame 40. The hanger 19 may be connected directly to, or integral with, the support frame 40.

In applications where the volume of the flexible membrane container 1 is reduced, as described above, the reduction in volume can be accomplished by rolling, folding, or similar methods and held in place with the support frame 40 or other internal or external fasteners to hold the roll or fold in place during operation, as described above.

In one embodiment, the support frame 40, the flexible membrane container 1, or both are configured to direct the flow or convection of the dielectric coolant inside the flexible membrane container 1. For example, the support frame 40 could be tapered on a first side of the electronic object 20, thereby reducing the circulation space 21 and reducing flow. The taper of the support frame 20 may expand the circulation space 21 on a second side of the electronic object 20, thereby promoting flow in proximity to the expanded circulation space 21. In this manner, the support frame 40 may determine the location of the membrane 10 in proximity to the electronic object 20, thereby modulating the flow area of the circulation space 21 and controlling flow inside the flexible membrane container 1.

In another embodiment, shown in FIGS. 23-26, the flexible membrane container 1 comprises one or more thermal exchange plates 45 disposed in thermal communication with the outside of the flexible membrane container 1 to facilitate heat transfer. The plates 45 may comprise a thermally conductive material, such as a metal, to facilitate heat flow. In this embodiment, the plates 45 are disposed in contact with the membrane 10, which permits thermal energy to pass from the dielectric coolant to the plate 45, and vice versa. In this embodiment, there is no flow inside the membrane 10, such as through the circulation space 21. Instead, the dielectric coolant is either disposed substantially statically inside the flexible membrane container 1, or it circulates inside the circulation space 21 by natural convection. In either the static state or the natural convection state, the dielectric coolant exchanges thermal energy with the plates 45 through the membrane 10. In one alternative of this embodiment, the flexible membrane container 1 does not have a circulation space 21, and the membrane 10 is placed in direct contact with the electronic object 20.

In an alternative of this embodiment, the plates 45 may be hollow members that contain heat transfer fluids, such as water or other liquids, gels, or various suitable solutions. These heat transfer fluids may or may not exhibit dielectric properties. In this embodiment, the heat transfer fluid is introduced into the plates 45 via one or more inflow conduits 12, and the fluid exits from the plates 45 via one or more outflow conduits 11. This embodiment can implement either an internal or external support frame 40, as described above, or it can have no support frame 40.

In another embodiment, the flexible membrane container 1 includes one or more baffles or other suitable objects that are configured to direct flow of the dielectric coolant inside the circulation space 21 and throughout the flexible membrane container 1.

Figure 30:
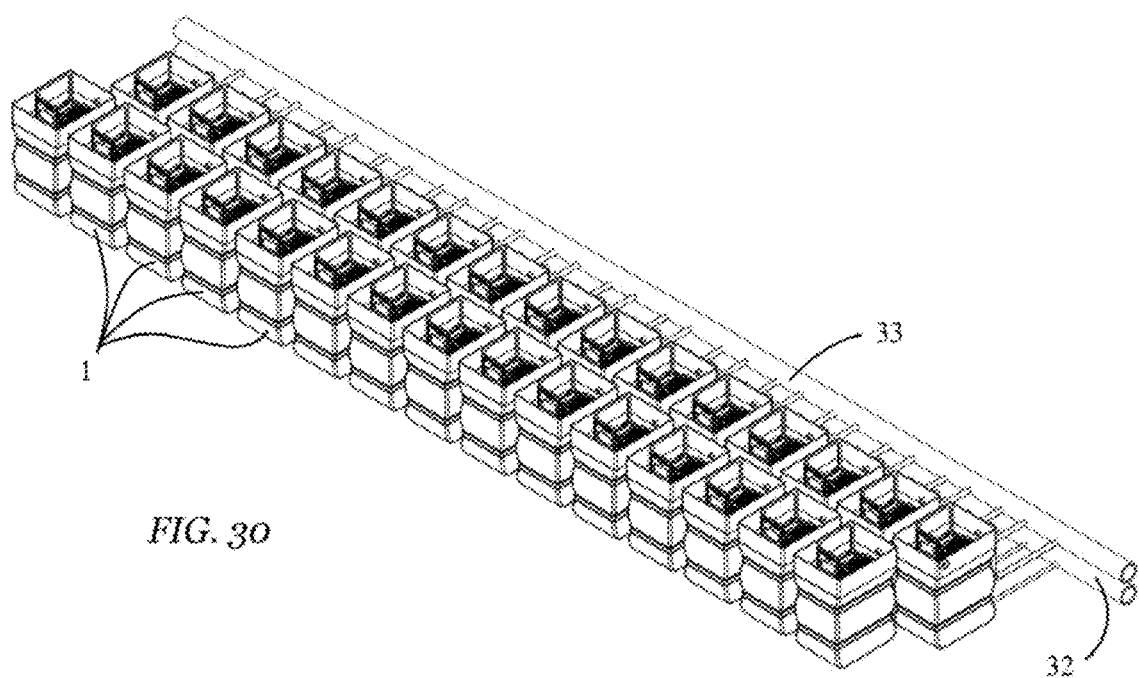
FIG. 30 is a perspective view of an embodiment of a system for thermal management of an array of flexible membrane containers having bitcoin miners disposed therein.
Figure 31:
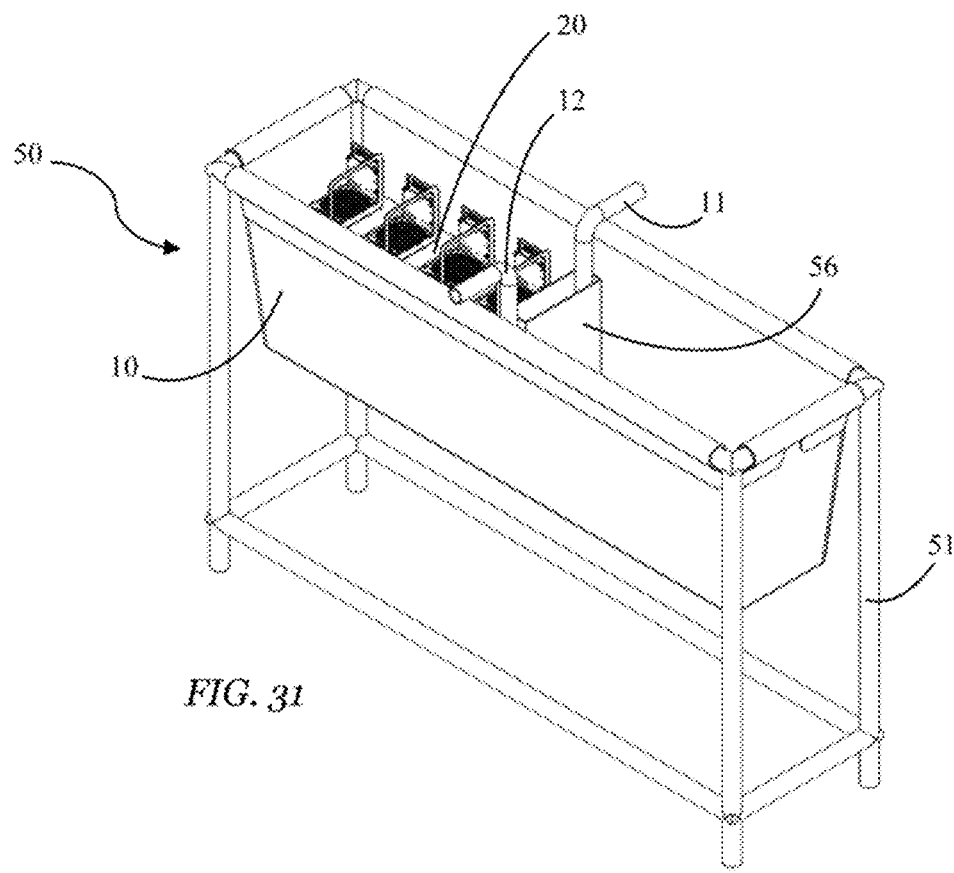
FIG. 31 is a perspective view of an embodiment of an immersion tank for thermal management of electronic objects.
Figure 32:
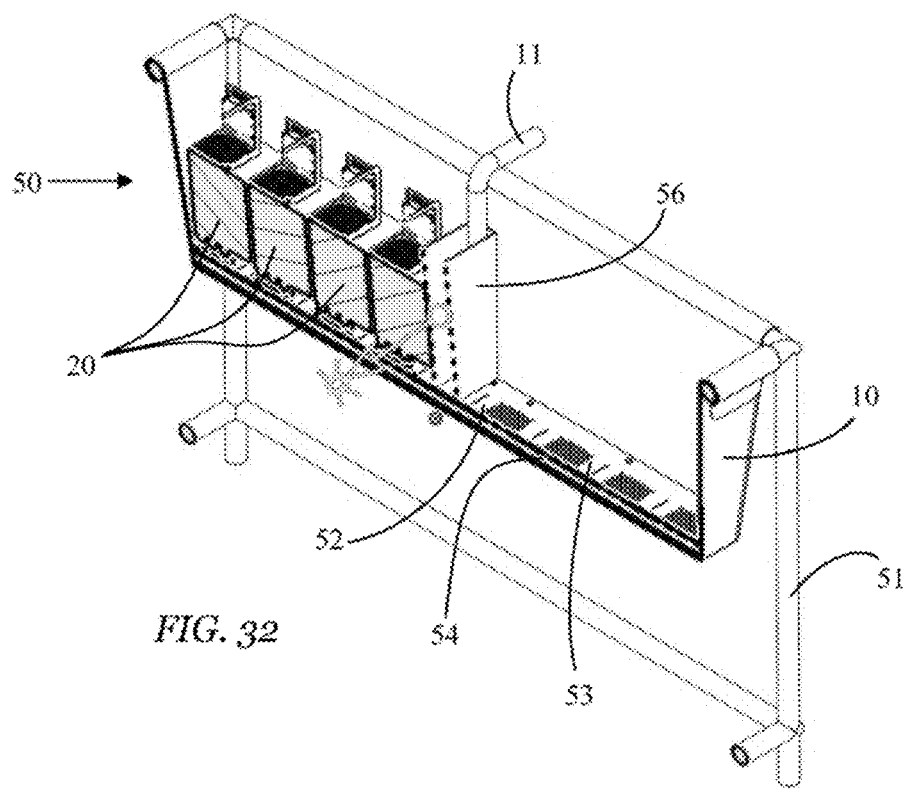
FIG. 32 is a partial perspective cross section of the embodiment shown in FIG. 31.
Figure 33:
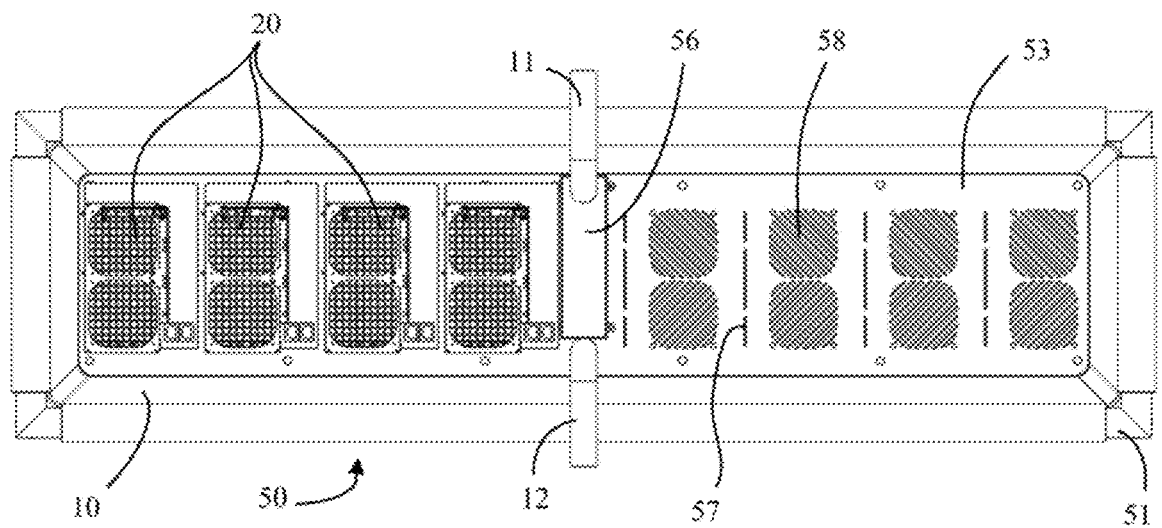
FIG. 33 is a top view of the embodiment shown in FIG. 31.
Figure 34:
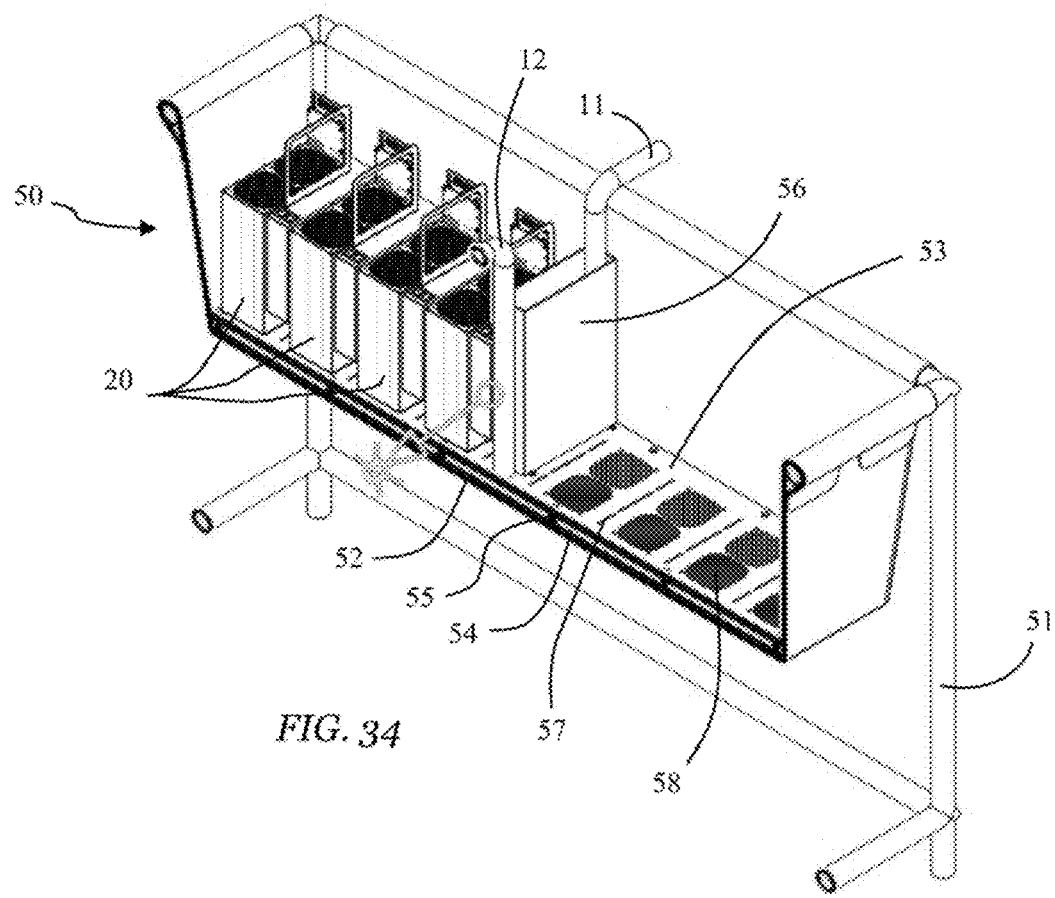
FIG. 34 is a perspective cross section of the embodiment shown in FIG. 31.
Figure 35:
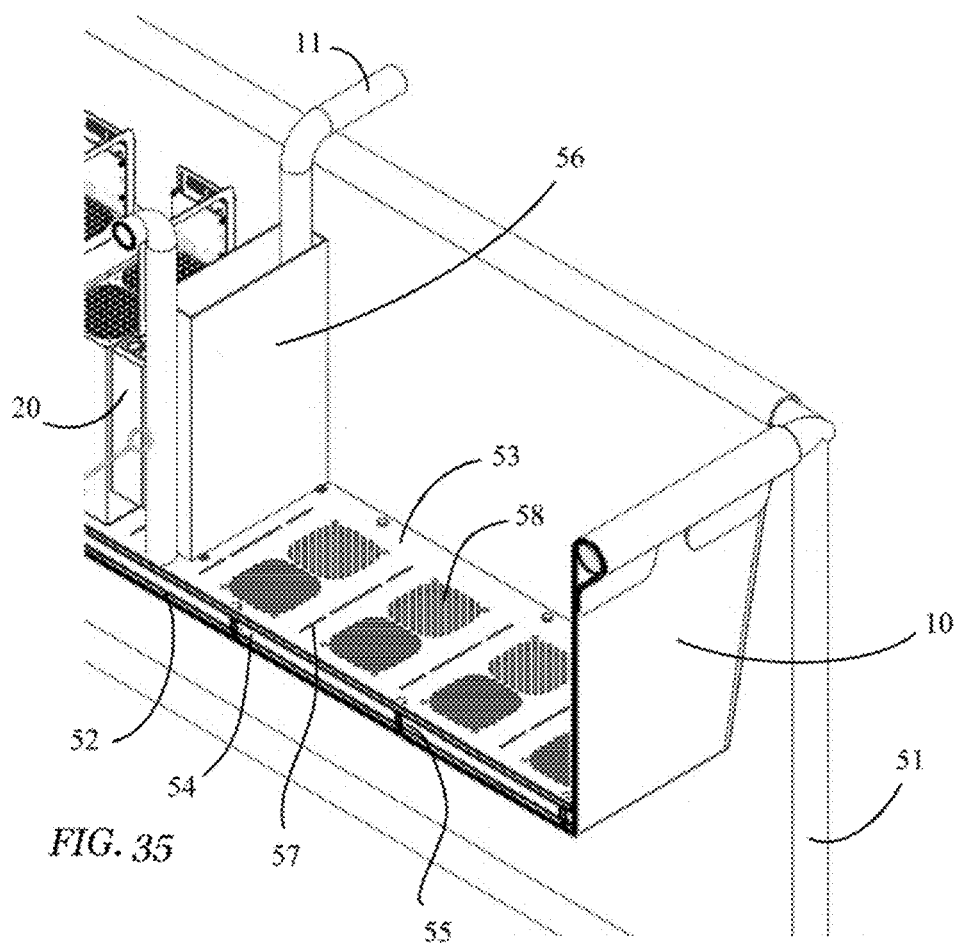
FIG. 35 is a partial perspective cross section of the embodiment shown in FIG. 31.
Figure 36:
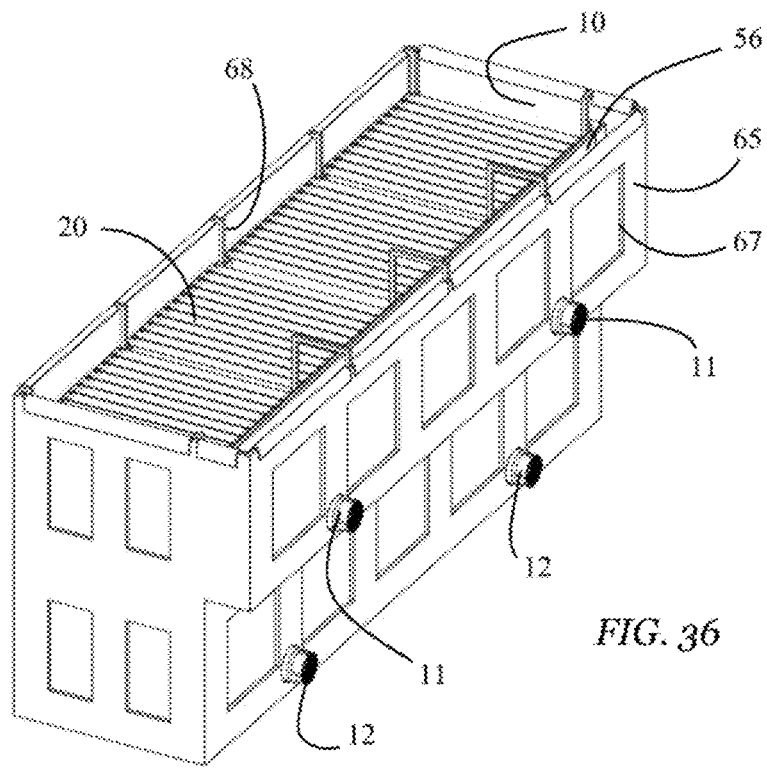
FIG. 36 is a perspective view of one embodiment of a flexible membrane container disposed inside a support structure.
Figure 37:
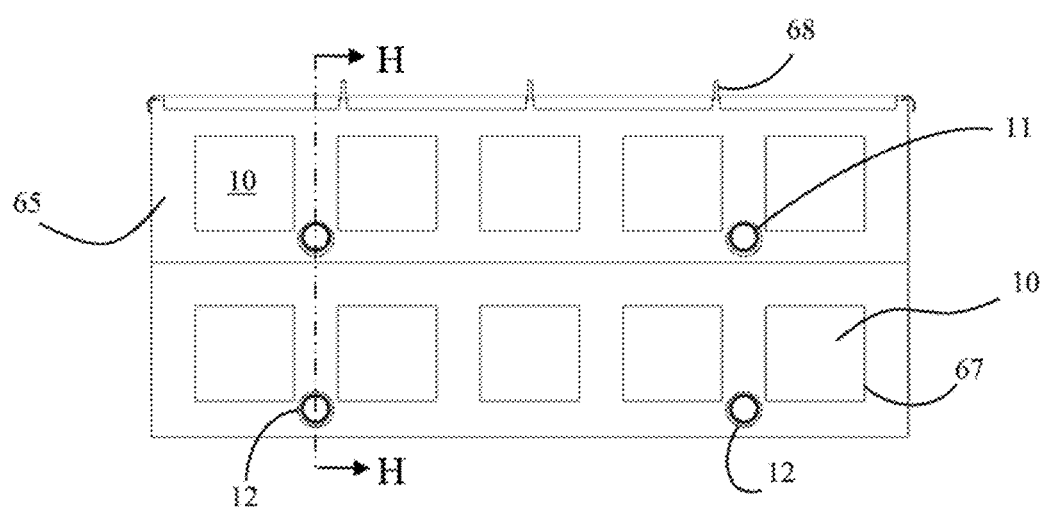
FIG. 37 is a side view of the embodiment shown in FIG. 36.
Figure 38:
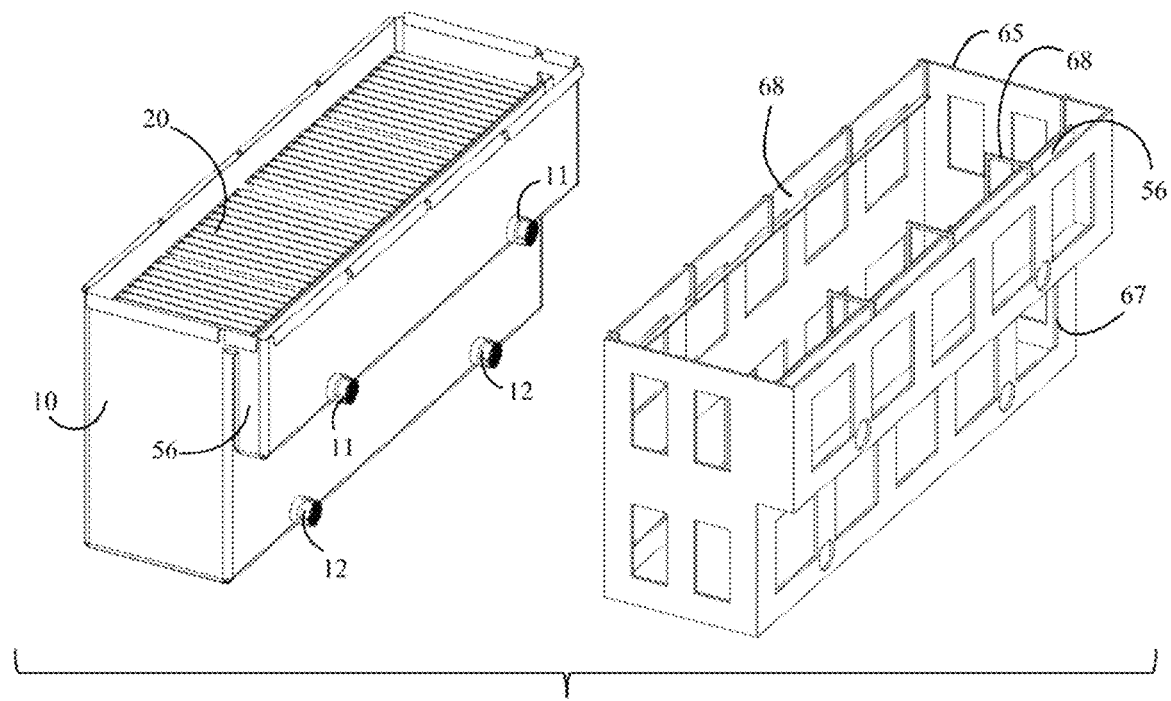
FIG. 38 is an exploded perspective view showing a support structure and rail system in relation to an array of computer servers disposed inside a membrane according to the embodiment shown in FIG. 36.
Figure 39:
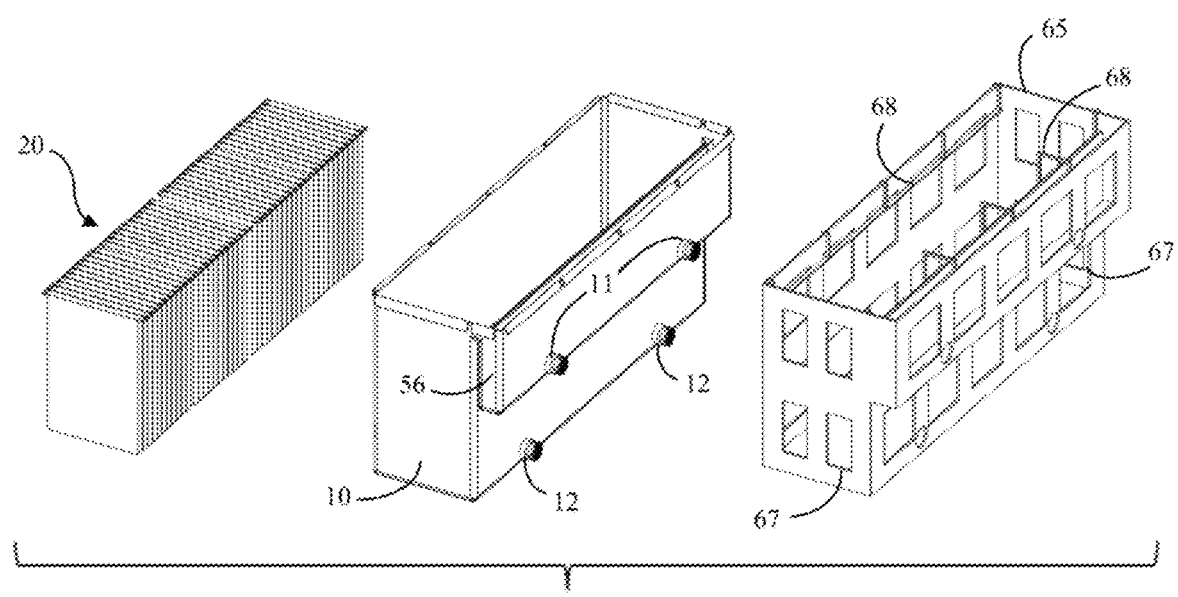
FIG. 39 is an exploded perspective view showing a support structure, a membrane, and an array of computer servers according to the embodiment shown in FIG. 36.
Figure 40:
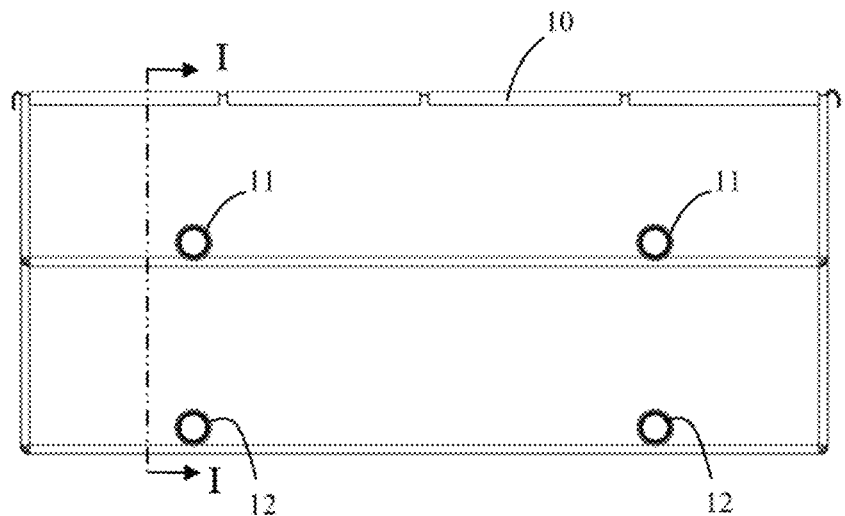
FIG. 40 is a side view of one embodiment of a membrane according to the flexible membrane container of FIG. 36.
Figure 41:
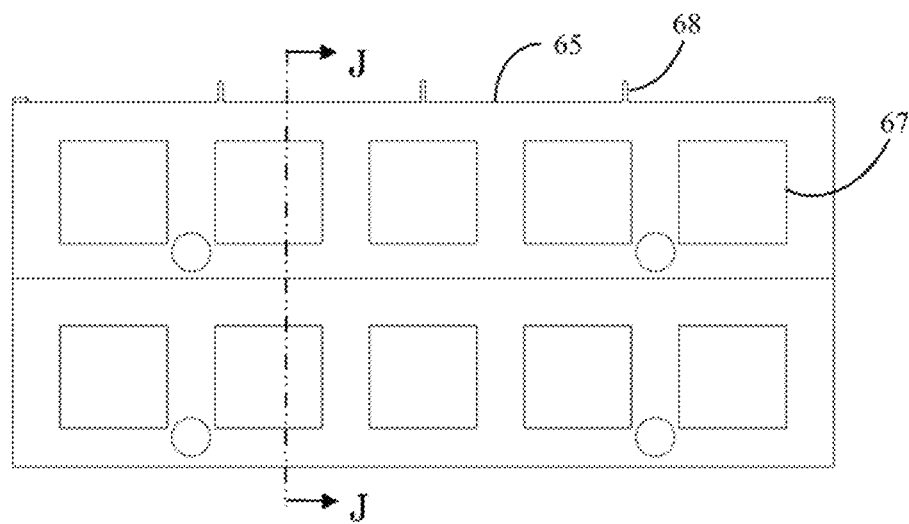
FIG. 41 is a side view of one embodiment of a support structure according to the flexible membrane container of FIG. 36.
Figure 45:
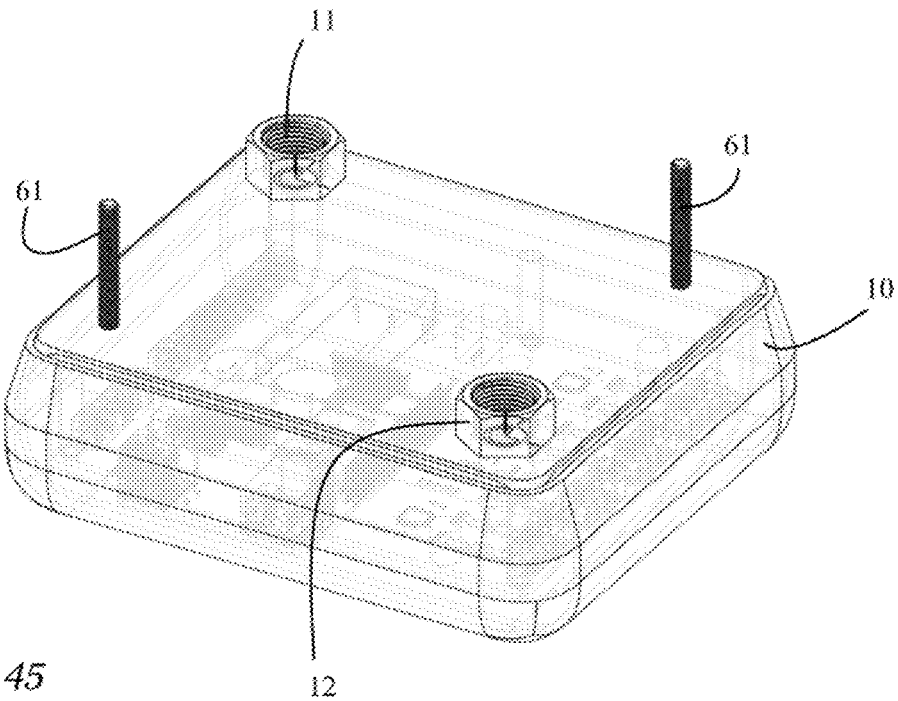
FIG. 45 is a perspective view of one embodiment of a flexible membrane container having a translucent rigid side and a translucent membrane.
Figure 46:
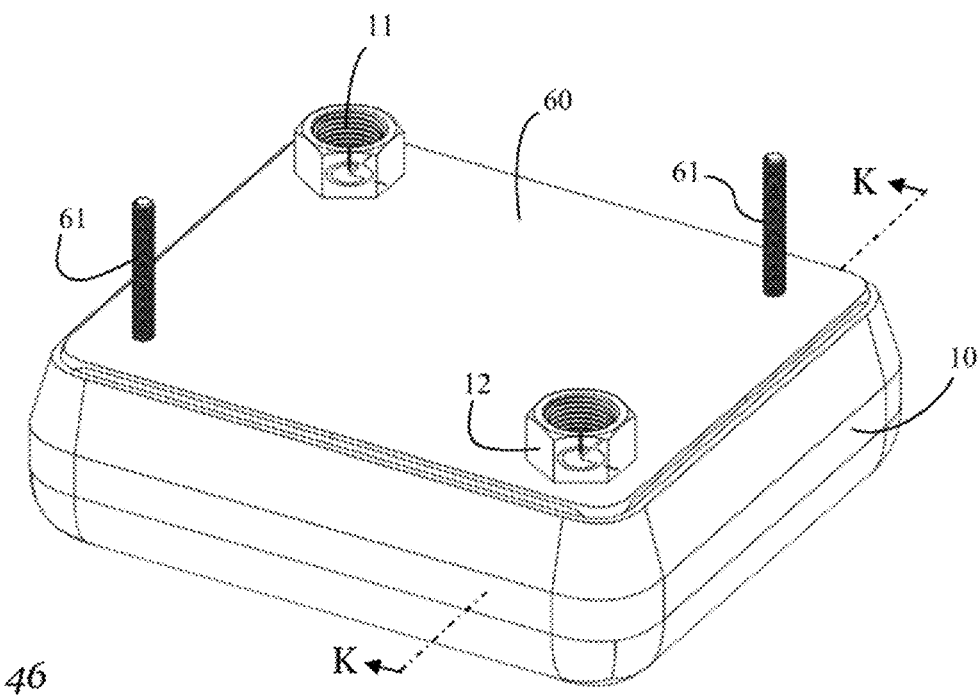
FIG. 46 is a perspective view of one embodiment of a flexible membrane container having one rigid side and an opaque membrane.
Figure 47:
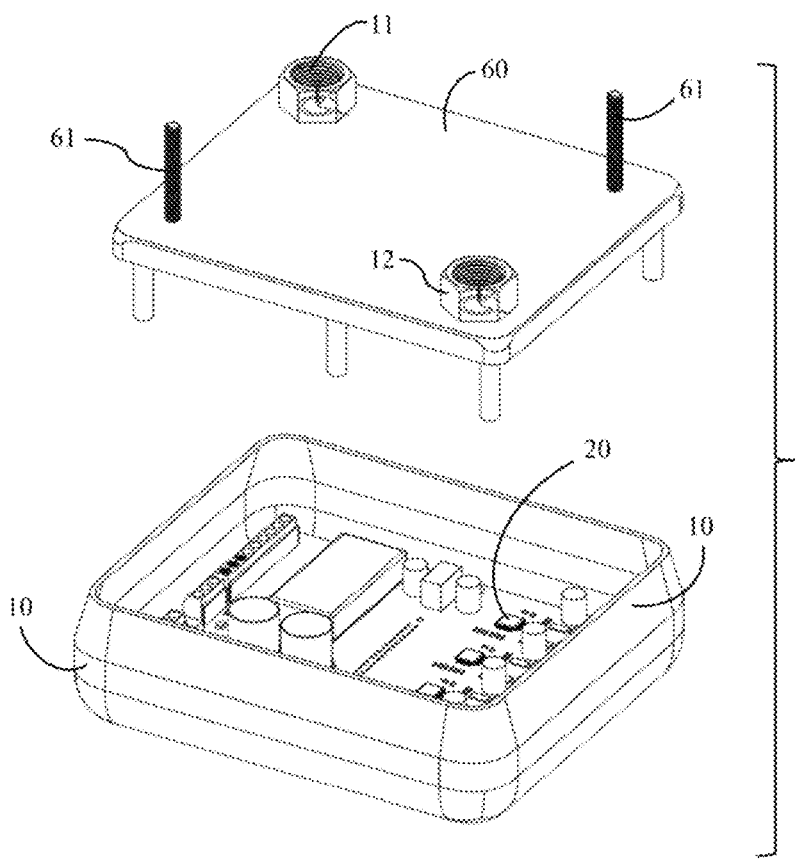
FIG. 47 is an exploded perspective view showing the embodiment of FIG. 46 with the rigid side detached from the membrane.
Figure 48:
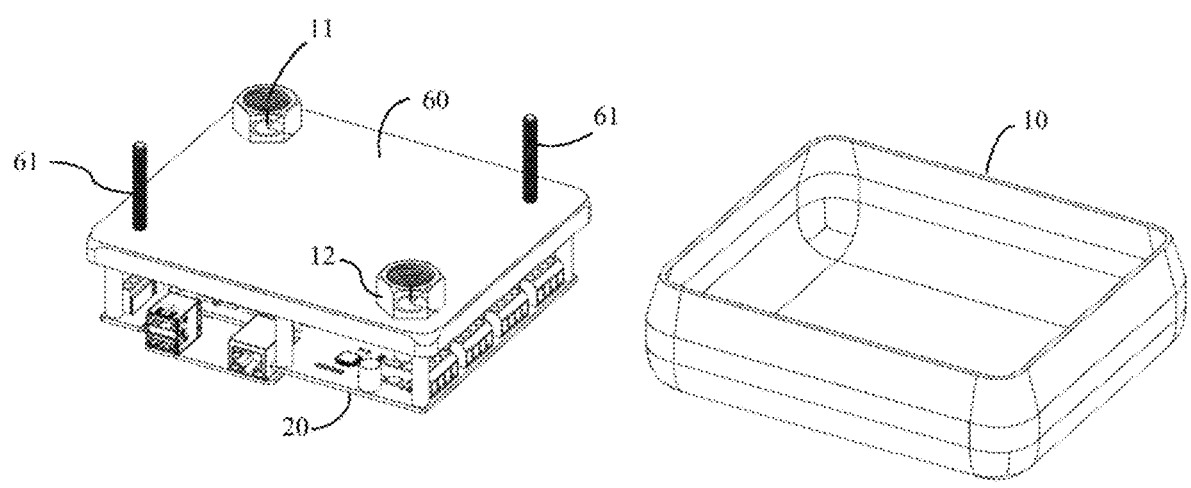
FIG. 48 is an exploded perspective view showing the embodiment of FIG. 46 with the membrane detached from the rigid side and the electronic object.
Figure 49:
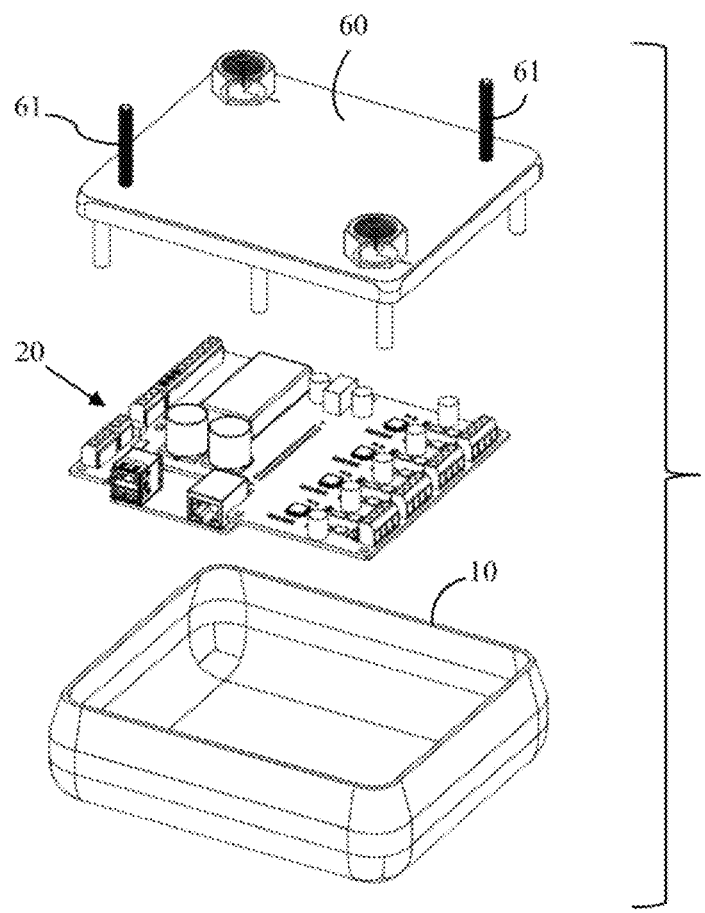
FIG. 49 is an exploded perspective view of the embodiment of FIG. 46.
Figure 50:
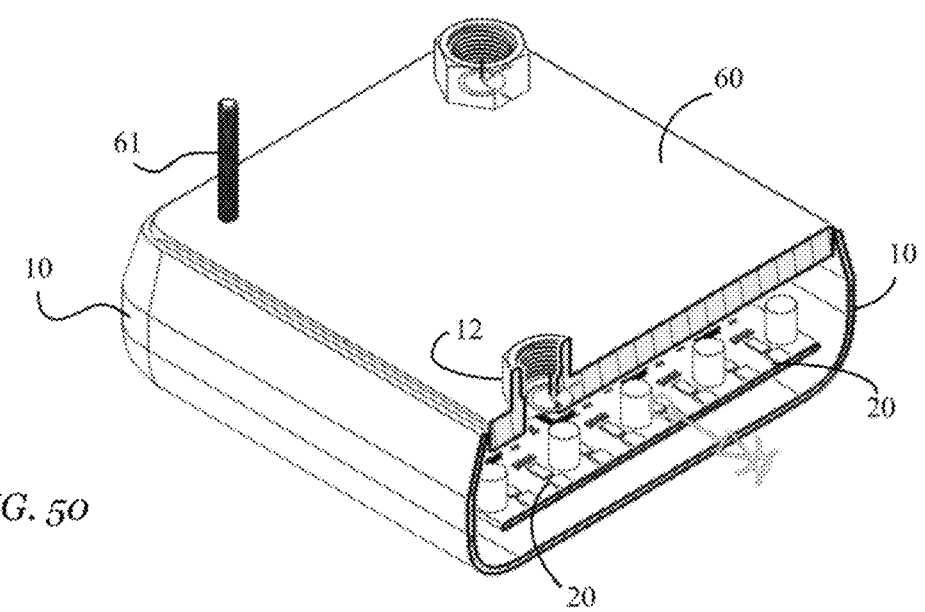
FIG. 50 is a perspective view of cross section K-K.

In another embodiment, shown in FIGS. 27-30, the electronic object 20 is a bitcoin miner, and the flexible membrane container 1 is retained in place, in part, by a support frame 40 comprising straps, such as nylon straps, hook and loop straps, polyethylene straps, or rubber straps. In this embodiment, the bitcoin miner 20 may be disposed on a structural base 47, such as one or more support stands, support legs, or support skids or frames, thereby providing circulation space 21 below the bitcoin miner 20. As in previous embodiments, the dielectric coolant is introduced into the flexible membrane container 1 via an inflow conduit 12, and the level of the dielectric coolant rises in the flexible membrane container 1 until it reaches the opening for the outflow conduit 11, where the dielectric coolant exits the flexible membrane container 1. FIG. 30 demonstrates a plurality of exemplary flexible membrane containers 1, each containing a bitcoin miner 20, and collectively deployed in an array in a system for dielectric liquid thermal management.

In another embodiment, shown in FIGS. 31-35, a membrane 10 according to the embodiments described above is disposed on a tank frame 51 in a manner defining a soft-sided tank 50. A first plate 52 and a second plate 53 are disposed apart in the bottom of the tank 50 such that an inflow space 54 is defined therebetween. If needed, separation between the first and second plates 52, 53 can be achieved via one or more spacers 55. The first and second plates 53 are rigid members that provide shape to the tank's 50 membrane 10. The second plate 53 comprises one or more slots 57 or vents 58.

In use, one or more electronic objects 20, such as bitcoin miners 20, are disposed inside the tank 50 on or near the second plate 53. Dielectric coolant enters the tank 50 via the inflow conduit 12 and flows into the inflow space 54. The dielectric coolant is dispersed throughout the inflow space 54 and rises above the level of the second plate 53 via the slots 57 or vents 58. The level of the dielectric coolant continues to rise, immersing the bitcoin miners 20 until the dielectric coolant flows into the spillway 56 and exits the tank 50 via the outflow conduit 11.

In another embodiment, shown in FIGS. 36-44, a solid or semisolid framework or similar support structure 65 is used to support one or more flexible membrane containers 1 in such a way that the flexible membrane container 1 provides containment of the dielectric coolant and electronic device 20, while the support structure 65 provides physical strength to support the flexible membrane container 1, the dielectric coolant, and electronic device 20. In this embodiment, the support structure 65 does not need to be manufactured in a liquid tight manner to retain the liquid dielectric coolant because the flexible membrane container 1 provides this characteristic by virtue of the membrane 10. In this embodiment, very large flexible membrane containers 1 can be made to contain either large electronic devices 20 or a large number (e.g., an array) of electronic devices 20.

For example, an exemplary flexible membrane container 1 according to this embodiment comprises a membrane 10 disposed inside the support structure 65, at least one inflow conduit 12, and at least one outflow conduit 11. The flexible membrane container 1 may further comprise an overflow bay 56 for receiving outflow of dielectric coolant that is moving away from the electronic object(s) 20. One or more outflow conduits 11 may be disposed in fluid communication with the overblow bay 56. The support structure 65 may comprise one or more apertures 67, which may be used for access to the membrane 10, to lighten the weight of the support structure 65, to reduce manufacturing costs, or for some other reason.

Figure 12:
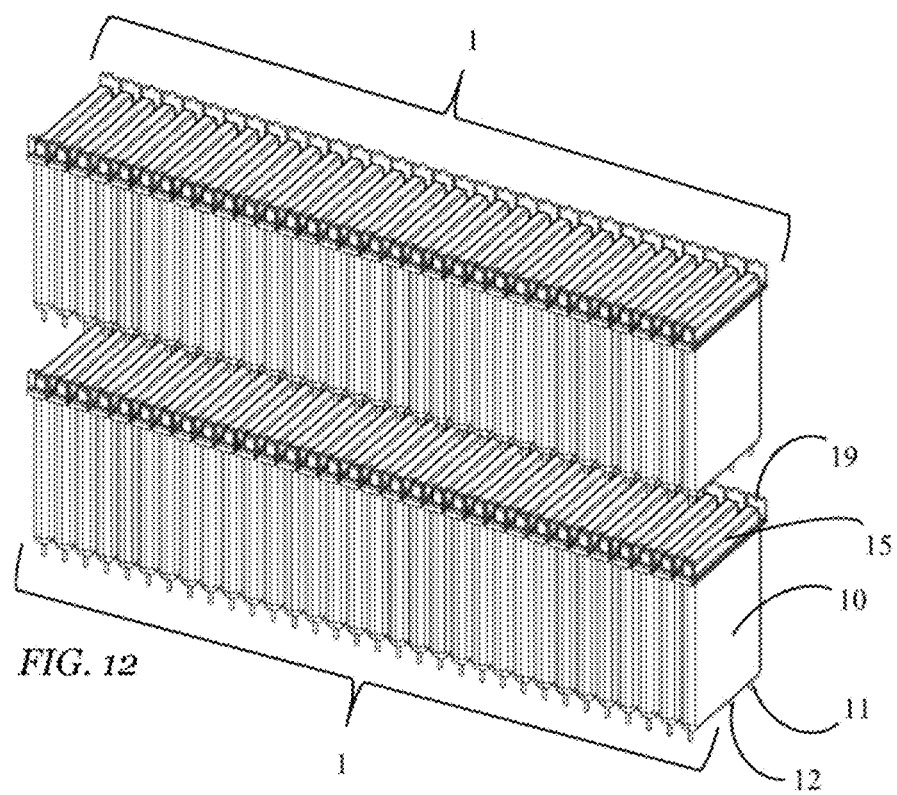
FIG. 12 is a perspective view of the array of flexible membrane containers shown in FIGS. 9 and 10.
Figure 13:
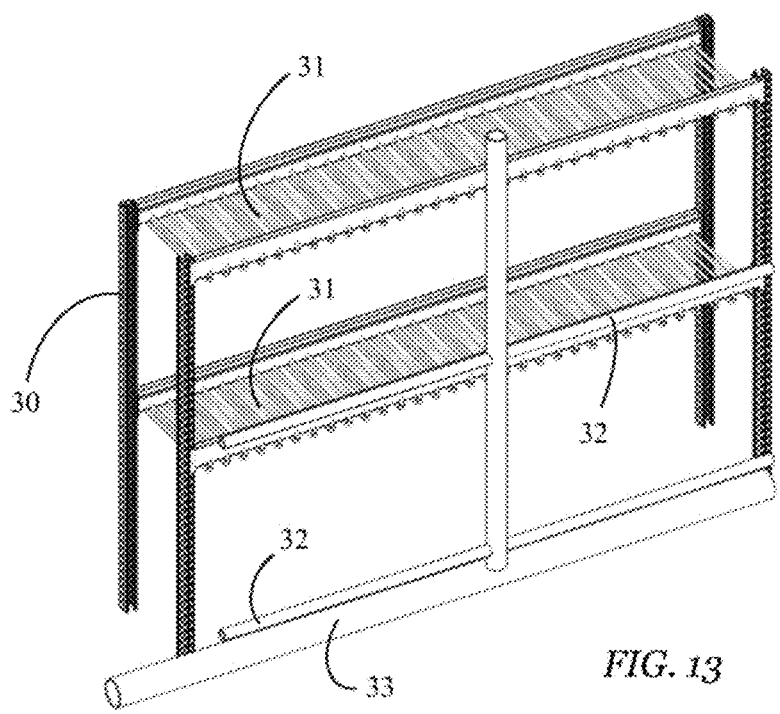
FIG. 13 is a rear perspective view of one embodiment of the frame shown in FIGS. 9 and 10.

The electronic object 20 is disposed inside the flexible membrane container 1 in a manner to promote thermal management. As one example, the electronic object 20 may comprise an array of computer servers 20 suspended by a rail system 68 disposed in connection with the flexible membrane container 1 or in connection with the support structure 65. In this embodiment, each server 20 is not disposed in its own membrane 10 in one-to-one relation (as shown in FIG. 12). Instead, the entire server array is disposed inside a membrane 10 such that a single membrane 10 contains multiple servers 20. The rail system 58 may be connected to the support structure 65, or some other suitable support, for the structural support needed to suspend the weight of the servers inside the flexible membrane container 1.

In another embodiment, shown in FIGS. 45-50, the membrane 10 is multilayered, comprising a combination of flexible layers of different materials with differing specifications and characteristics, in which each type of material serves a specific purpose in the containment, thermal management, environmental protection, and interface to other electrical devices, which may be determined by the practical application. As one example of this embodiment, the flexible membrane container 1 comprises a generally rectangular shape having a single rigid side 60, and all other sides being flexible. The flexible membrane container 1 comprises at least one inflow conduit 12 and at least one outflow conduit 11. The rigid side 60 serves the purpose of mounting the fluid flow connectors (e.g., inflow conduit 12 and outflow conduit 11) and electrical interface connections for the electronic object 20. The rigid side 60 may be attached to external supports by one or more mechanical connectors 61. In a variation of this embodiment, the flexible membrane container 1 may further comprise a rigid bottom (not shown), where the bottom enables attachment of the container to a racking system similar to that described above.

Figure 51:
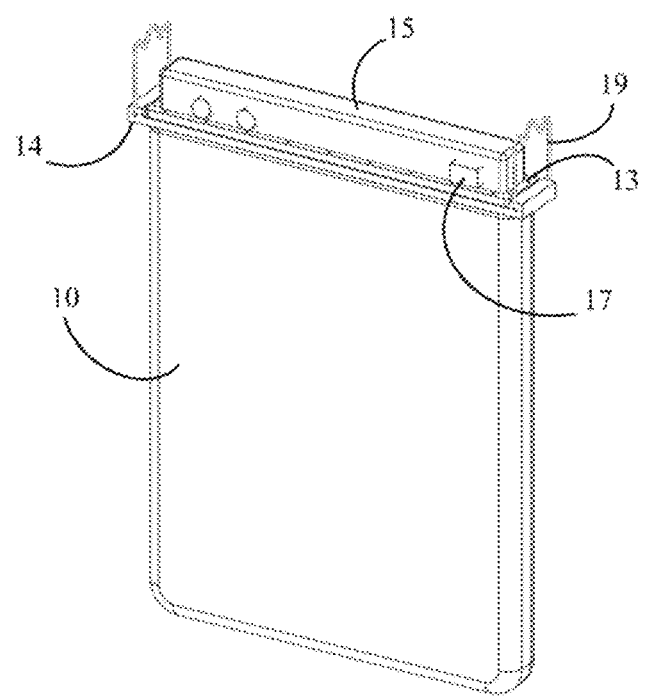
FIG. 51 is a perspective view of an embodiment of a flexible membrane container having no inflow conduit and no outflow conduit.

In another embodiment, shown in FIG. 51, the flexible membrane container 1 does not have an inflow conduit 12 or an outflow conduit 11. Instead, the flexible membrane container 1 is filled with dielectric coolant, which circulates by natural convection inside the flexible membrane container 1. The dielectric coolant is cooled or otherwise exchanges thermal energy via the transfer of heat energy through membrane to an external fluid, such as ambient air, water, or another suitable fluid. This modality of thermal management could be deployed in any of the embodiments described above so that such embodiments rely on natural convection and external thermal exchange to thermally manage the electronic object 20. When the embodiments of flexible membrane container 1 described above are further adapted in this manner, the inflow conduit(s) 12 and/or outflow conduit(s) 11 are used to assist in introducing into or draining from the flexible membrane container 1 the dielectric coolant needed for thermal management. However, such adapted embodiments are used for thermal management by deploying natural convection rather than by continuously circulating dielectric coolant through inflow conduits 12 and outflow conduits 11 as described above, even in instances where the inflow conduit(s) 12 and outflow conduit(s) 11 remain fluidly connected as shown and described above.

In another embodiment, shown in FIGS. 52-60, the flexible membrane container 1 is used to thermally manage an electronic object 20, such as a bitcoin miner. Certain embodiments of bitcoin miners have thermal properties and attributes that may benefit from specific flow patterns of dielectric coolant through the object 20. For example, where the electronic object 20 is a Bitman Antminer S19 bitcoin miner or similar miner, the thermal management object may be best achieved by providing a swirling flow of dielectric coolant, as described below.

Figure 52:
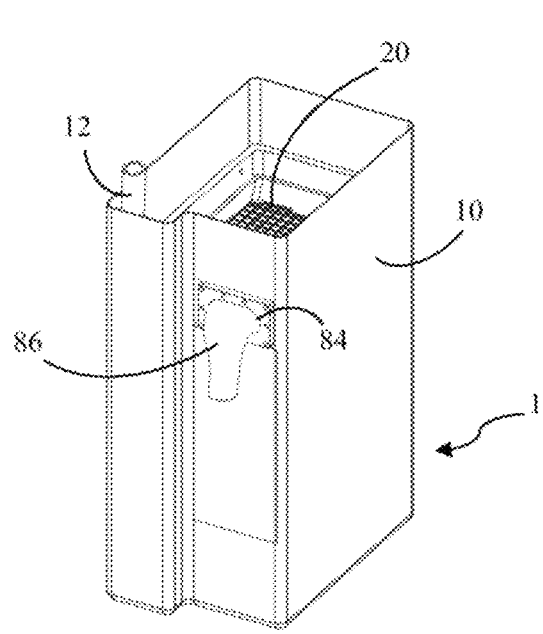
FIG. 52 is a perspective view of an embodiment of a flexible membrane container having a membrane disposed outside a bitcoin miner.
Figure 53:
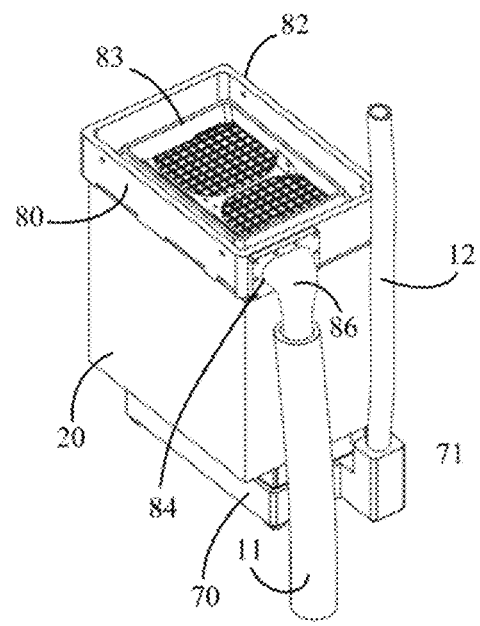
FIG. 53 is a perspective view of an embodiment of a bitcoin miner disposed on a base and having an outflow regulator.
Figure 54:
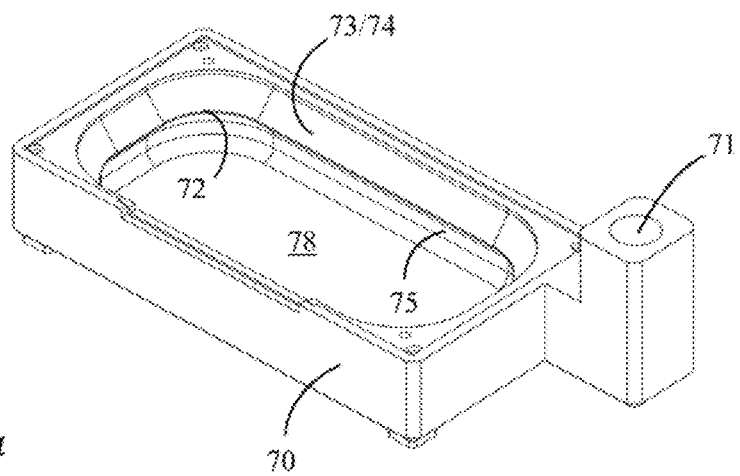
FIG. 54 is a perspective view of an embodiment of a base adapted for use with a bitcoin miner.
Figure 55:
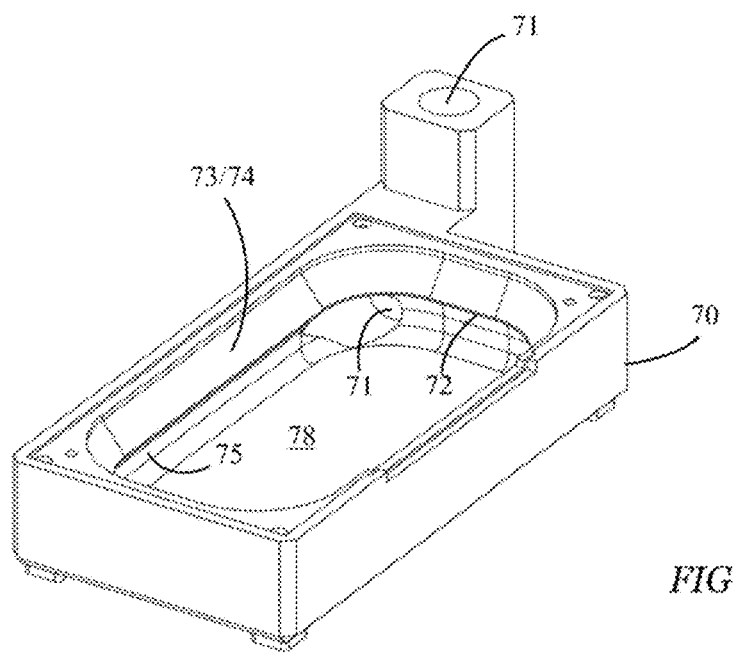
FIG. 55 is a perspective view of an embodiment of a base adapted for use with a bitcoin miner.
Figure 56:
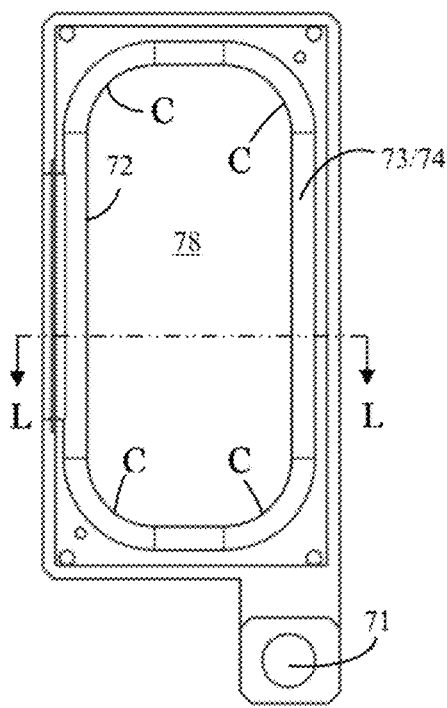
FIG. 56 is a top view of an embodiment of a base adapted for use with a bitcoin miner.
Figure 57:
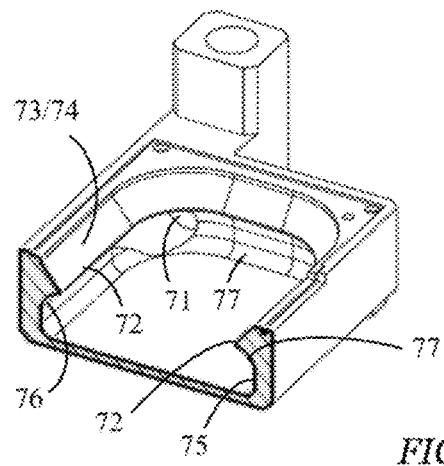
FIG. 57 is a perspective view of cross section L-L.
Figure 58:
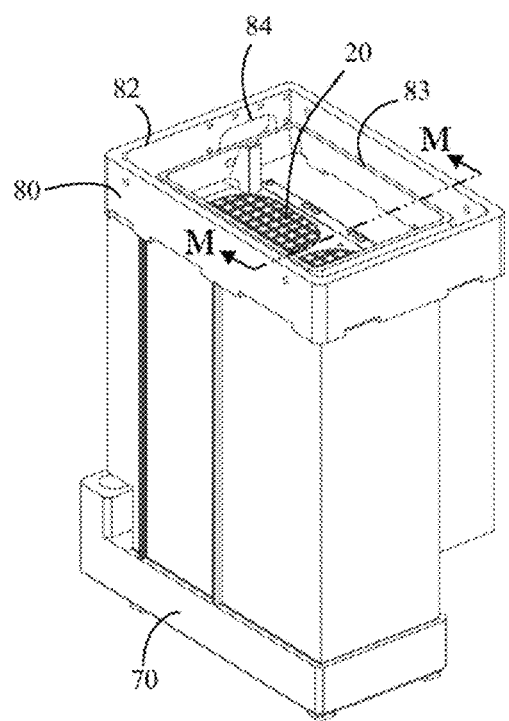
FIG. 58 is a perspective view of a bitcoin miner disposed on a base and having an outflow regulator.
Figure 59:
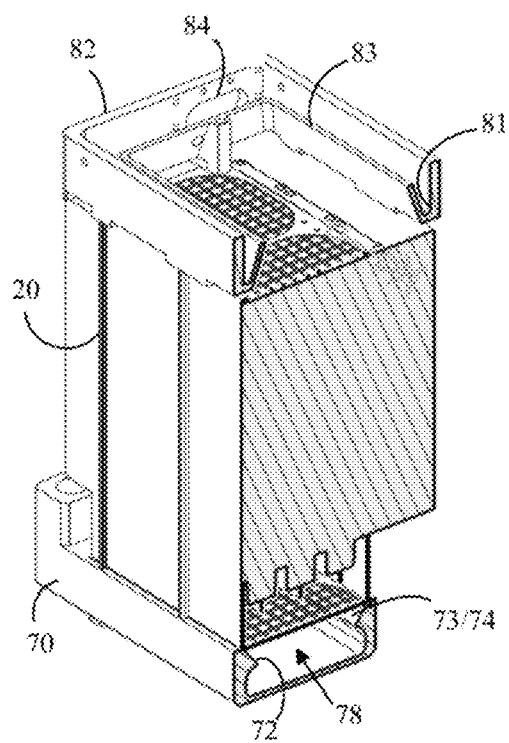
FIG. 59 is a perspective view of cross section M-M.
Figure 60:
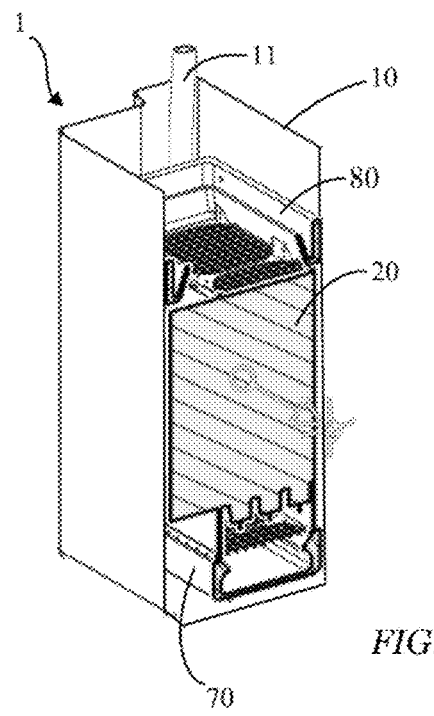
FIG. 60 is a cross section showing an embodiment of a bitcoin miner disposed in a flexible membrane container.
Figure 61:
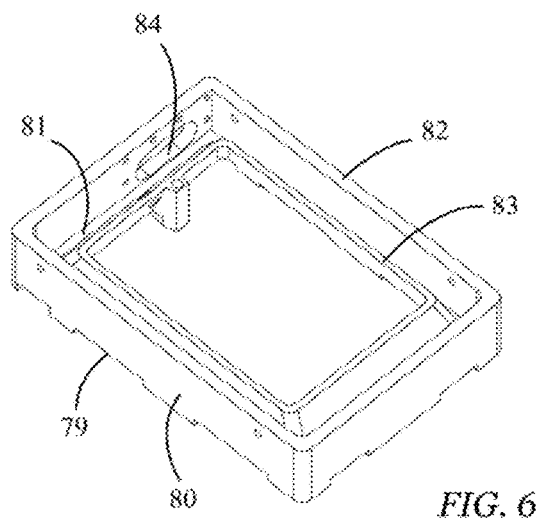
FIG. 61 is a perspective view of one embodiment of an outflow regulator.
Figure 62:
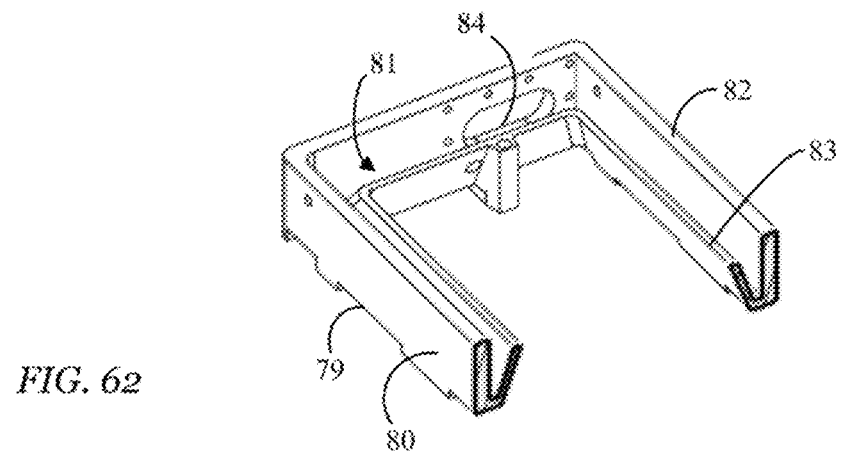
FIG. 62 is a perspective view of an embodiment of an outflow regulator through cross section M-M.

This embodiment comprises a substantially ridged riser or base 70 upon which the electronic object 20 is seated. The base 70 operates as a flow regulator, such as by agitating, mixing, diffusing, or otherwise managing the flow of the dielectric coolant. For example, one embodiment of the base 70 is substantially rigid and has a substantially rectangular footprint with rounded corners, having an inlet port 71 disposed near one of the corners of the rectangle. The inlet port 71 enables inflow conduit 12 to attach to the base 70 so that the membrane 10 does not have to be punctured to permit entry of the inflow conduit 12. The base 70 further comprises a contoured shelf 72 that defines a tapered recess 73 on a top side 74 of the contoured shelf 72, and defines a contoured channel 75 on a bottom side 76 of the contoured shelf 72. The channel 74 has smooth contours to promote swirling fluid flow. For example, the channel 74 may have filleted corners 77 that extend along all or a portion of the length of the channel 74. In the vicinity of the corners of the rectangular base 70, the channel may further comprise rounded corners C to further promote smooth fluid flow. The bitcoin miner 20 is seated in or on the tapered recess 73 of the base 70 such that the space below the shelf 72 defines a mixing compartment 78 for the dielectric fluid. This assembled apparatus may be placed inside the membrane 10, as shown in FIG. 52.

In operation, as the dielectric coolant passes through the inflow conduit 12 and enters the base 70 via the inlet port 71 near a corner of the base 70. The dielectric coolant enters into the channel 75, travelling along the length thereof. The shape of the channel 75 causes the dielectric coolant to swirl inside the mixing compartment 78. As the dielectric coolant continues to enter into the base 70 and rise in the mixing compartment 78, the dielectric coolant continues to swirl as its surface level rises above the shelf 75. The dielectric coolant continues to swirl as it rises though the electronic object 20 inside the flexible membrane container 1. This swirling action improves the thermal management ability in relation to the Bitman Antminer S19 bitcoin miner and in other similar miners.

Certain applications of the flexible membrane container 1 may be used in connection with an outflow regulator 80 disposed in connection with the electronic object 20. For example, referring to FIGS. 58-62, an embodiment of the outflow regulator 80 is shown disposed at the top of a bitcoin miner. The outflow regulator 80 is configured for mating attachment to or near the top of the electronic object 20. Thus, for the bitcoin miner, the outflow regulator 80 is substantially rectangular.

The outflow regulator 80 comprises a trough 81 defined by an outer wall 82 and an inner wall 83. In this embodiment, the outer wall 82 is substantially vertical, and the inner wall 83 is disposed at an angle away from the outer wall 82 and toward the center of the electronic object 20, thereby defining a substantially asymmetric V-shaped cross section (See, e.g., FIG. 62). The top of the outer wall 82 is disposed at a higher location than the top of the inner wall 83.

The outflow regulator 80 further comprises an outlet port 84 disposed in the outer wall 82. The outlet port 84 is disposed in a shape that is wider than it is high, which is advantageous because the outflow of the dielectric coolant is not pressurized to the same extent as the inflow dielectric coolant. The outlet port 84 may further comprise a downspout 86 for fluidly communicating with the outflow conduit 11. The downspout 86 may comprise an elbow or other angle-adjusting feature to enable the outflow conduit 11 to be disposed in close proximity to the electronic object 20, thereby reducing the lateral profile of the overall flexible membrane container. The outlet port 84 and downspout 86 are attached to the membrane 1 by one or more expansion inserts for mechanical fasteners (e.g. threaded fasteners) to enable attachment to the membrane 10 without causing damage to the membrane 10 material.

Figure 63:
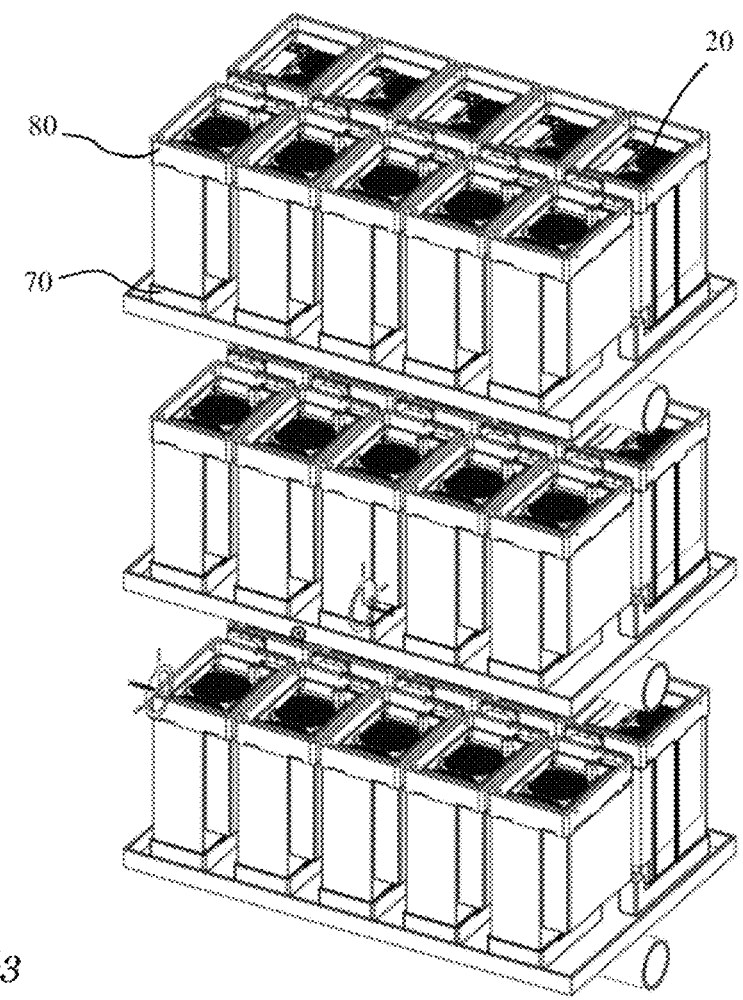
FIG. 63 shows an array of bitcoin miners disposed according to one embodiment of the flexible membrane container.
Figure 69:
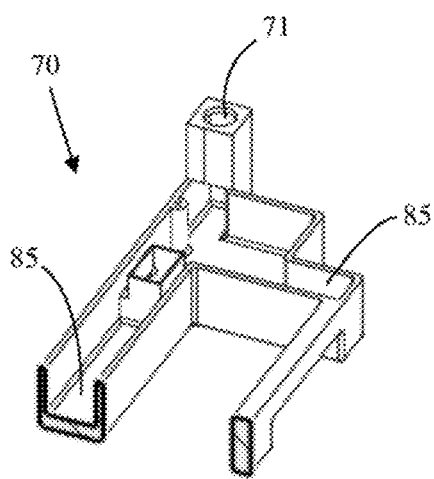
FIG. 69 is a perspective view of cross section N-N through a base adapted for use with a server.

In use, the surface level of the dielectric coolant rises through the electronic object 20 and enters into the outflow regulator 80 inside the inner wall 83. The dielectric coolant level reaches the top of the inner wall 83 and flows into the trough 81, through which the dielectric coolant is channeled to the outflow port 84, where it exits through the outflow conduit 11. The outflow regulator 80 may further comprise one or more drains 79, such as weep holes or other drain ports or slots to promote flow of the dielectric coolant from near the top of the electronic object 20 back into the flexible membrane container 1. As shown in FIG. 63, an array of these electronic objects 20, such as the Bitman Antminer S19 or any other miner, can be disposed in a stacked array, multiple rows deep, and including multiple levels.

In an embodiment where the electronic object 20 is a server, the configuration of the foregoing embodiments differs slightly because servers tend to have processors, which tend to embody point sources of heat as opposed to the plates of certain bitcoin miners. Referring to FIGS. 64-70, in an embodiment where the electronic object 20 is a server, such as a 4U server, the server 20 is disposed on a base 70 that has a footprint correlating to the shape of the server 20 housing. In many embodiments, the footprint of the server 20, and therefore the base 70, is roughly rectangular. The base 70 comprises an inlet port 71 disposed in fluid communication with the inflow conduit 12.

The base 70 further comprises one or more channels 85 disposed in fluid communication with the inlet port 71, and further configured to direct the dielectric coolant to the heat-generating portions of the server 20. Thus, one or more channels 85 may be offset in relation to the overall footprint of the base 70. Referring to FIGS. 67 and 68, one such channel 85a is disposed such that the dielectric coolant is directed to a prominent heat-generating component 87 of the electronic object 20. Once the dielectric coolant enters the channel 85, the dielectric coolant matriculates upward toward the heat-generating component 87, as indicated by the arrow F in FIG. 68.

Figure 70:
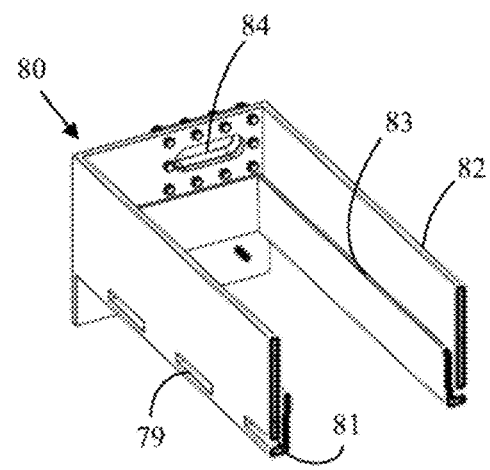
FIG. 70 is a perspective view of cross section P-P through an outflow regulator adapted for use with a server.
Figure 71:
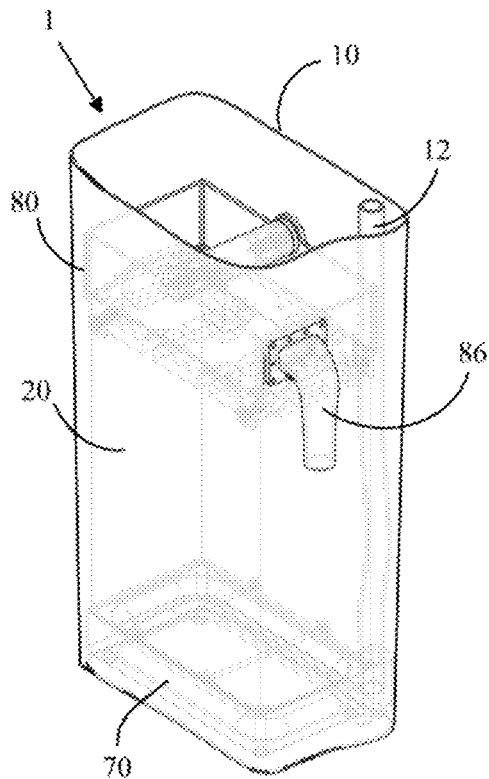
FIG. 71 is a perspective view of a bitcoin miner deployed inside a flexible membrane container.
Figure 72:
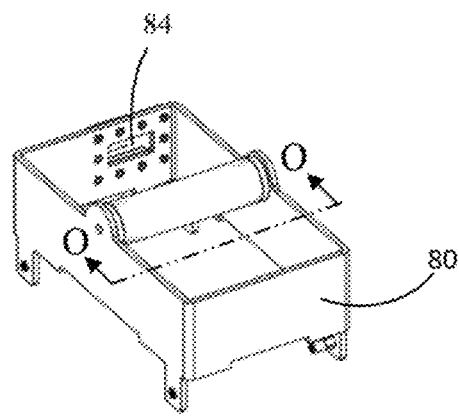
FIG. 72 is a perspective view of an outflow regulator adapted for use with one embodiment of a bitcoin miner.
Figure 73:
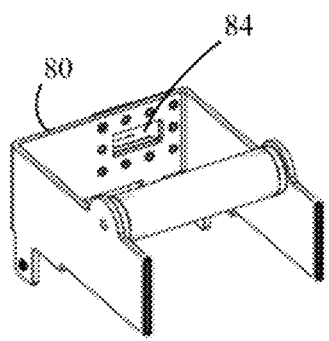
FIG. 73 is a perspective view of an outflow regulator through cross section O-O.
Figure 74:
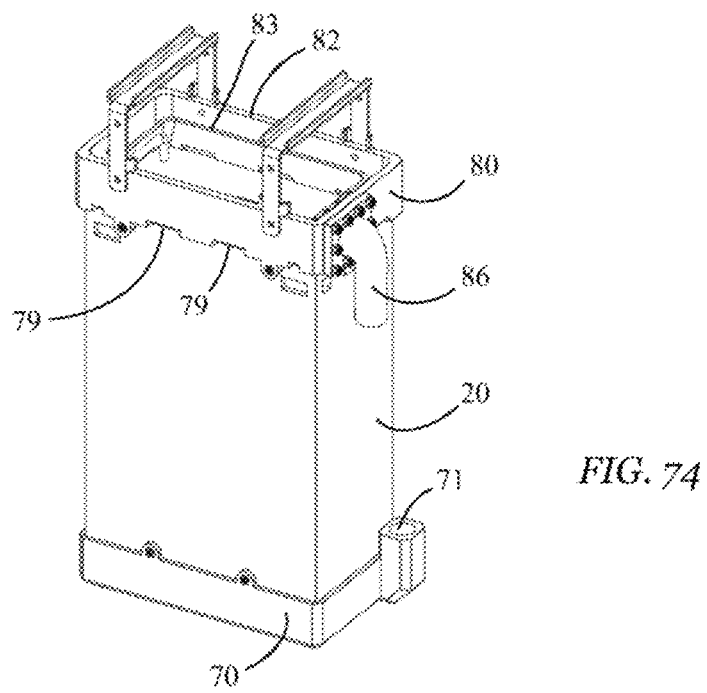
FIG. 74 is a is a perspective view of embodiments of a base and an outflow regulator disposed in relation to a bitcoin miner, with the flexible membrane not shown for clarity.
Figure 75:
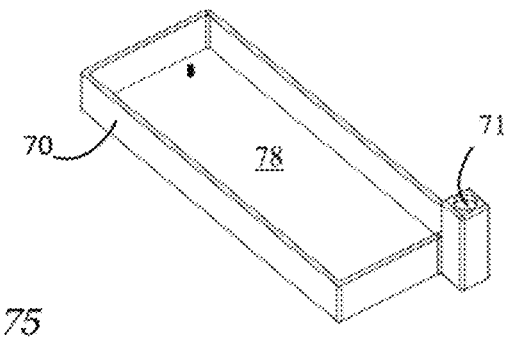
FIG. 75 is a perspective view of an embodiment of a base configured for use with a computer server.

In this embodiment, the outflow regulator 80, shown in FIG. 70, may comprise an inner wall 83 that is substantially vertical. The trough 81 may comprise one or more drains 79, such as slots, scuppers, weep holes, or the like, which enable dielectric coolant in the trough 81 to flow through the drain 79 an outside the electronic component while remaining inside the membrane 10. In this embodiment, the outflow regulator 80 further comprises an outlet port 84 and a downspout 86, as described above in relation to previous embodiments.

In another embodiment of the flexible membrane container 1, shown in FIGS. 71-74, the container 1 is used again in relation with a bitcoin miner, such as a MicroBT WhatsMiner M56. In this embodiment, the flexible membrane container 1 may comprise a base 70 similar to that described above in relation to the bitcoin miner. However, in this embodiment, the outflow regulator 80 comprises only a single wall.

In any of the foregoing embodiments, a second membrane 10 can be used as a second container for the thermal management of the electronic object 20. For example, in an embodiment where a first membrane 10 envelops the electronic object, a second membrane can be used to envelop the first membrane 10. In embodiments where a first membrane 10 is disposed inside a frame, a second membrane 10 can be disposed outside the frame. In embodiments where the dielectric coolant is deployed inside a hard-sided tank, a membrane 10 can be used either inside or outside the tank as a second barrier for containment of the dielectric coolant. An ordinary practitioner will appreciate that other combinations of dual membranes 10 fall within the scope of the flexible membrane container 1 described herein.

Figure 76:
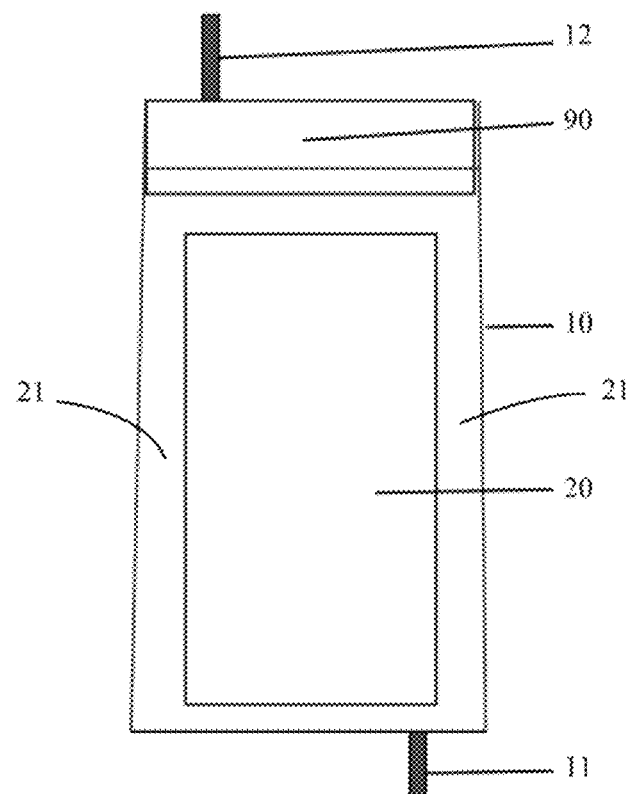
FIG. 76 is a schematic view of an embodiment of flexible membrane container having an inflow regulator to control a top-down flow direction.

Many of the embodiments described above can be altered to reverse flow of the dielectric coolant through the flexible membrane container 1. Instead of the dielectric coolant being introduced near the bottom of the flexible membrane container 1 and flowing toward the top, the dielectric coolant is introduced at or near the top of the flexible membrane container 1 and flows or matriculates toward the bottom. For example, referring to FIG. 76, once the electronic object 20 is inserted into the first flexible membrane 10, a dielectric coolant is introduced into the flexible membrane container 1 via the inflow conduit 12. The dielectric coolant flows into the top of the flexible membrane container 1 and exits out the bottom of the flexible membrane container 1. As the dielectric coolant flows through the electronic object 20, passing through the components of the electronic object 20 and/or passing through the circulation space 21 to immerse or partially immerse the electronic object 20. This process enables heat exchange between the dielectric coolant and the electronic object 20. The level of dielectric coolant remaining in the container as it flows through the electronic object 20 can range from none to full. When the dielectric coolant reaches the bottom of flexible membrane container 1, it flows through the outflow conduit 11 and exits the flexible membrane container.

To promote this top-down flow direction, the flexible membrane container 1 may further comprise on or more flow dispersion members that function as an inflow regulator 90, such as one or more diffusers or diffuser plates. The inflow regulator 90 is disposed near the top of the flexible membrane container 1. The inflow regulator 90 disperses the flow of dielectric coolant in a manner more advantageous for thermal management of the electronic object 20. For example, the inflow regulator 90 may spread the inflowing dielectric coolant more evenly across the top of the electronic object 20 in the membrane 10 so that as the dielectric coolant flows down through the membrane 10 its thermal properties are spread more uniformly throughout the first interior volume. Alternately, the inflow regulator 90 is configured to direct the dielectric coolant to a certain location or area of the electronic object 20 to promote improved thermal management of the specific electronic object 20 disposed inside the membrane 20.

In another embodiment, the inflow regulator 90 comprises a chamber and/or a flow control plate with holes, slots, and other shapes, vents, or apertures of various sizes to disperse the flow of dielectric coolant through the plate and into the first interior volume. The dielectric coolant can then flow through the interior of the electronic object 20 with a sufficient amount of flow to allow the dielectric coolant sufficient volume to efficiently manage the thermal energy of the electronic object 20 by way of the flow of dielectric coolant through and/or around the electronic object 20. The dielectric coolant then flows from the flexible membrane container 1 through the outlet conduit 11 located in proximity to the bottom (or disposed in a side) of the flexible membrane container 1.

The foregoing embodiments are merely representative of the flexible membrane container and not meant for limitation of the invention. For example, persons skilled in the art would appreciate that there are several embodiments and configurations of membrane layers and functionality that will not substantially alter the nature of the flexible membrane container. Consequently, it is understood that equivalents and substitutions for certain elements and components set forth above are part of the invention described herein, and the true scope of the invention is set forth in the claims below.

What is claimed is:

1. A flexible membrane container for thermal management of an electronic object, the flexible membrane container comprising:
    a first flexible membrane forming all lateral walls and a bottom of the flexible membrane container having a first interior volume, the flexible membrane container having an opening for removably receiving the electronic object into the first interior volume, wherein the first flexible membrane is made of a material adapted for folding, clamping, cinching, crimping, rolling, or collapsing;
    an inflow conduit disposed in fluid communication with the first interior volume and configured to enable a liquid dielectric coolant from a source external to the flexible membrane container to enter into and fill the first interior volume, thereby immersing the electronic object into the liquid dielectric coolant;
    an outflow conduit disposed in fluid communication with the first interior volume and configured to enable the liquid dielectric coolant to exit from the first interior volume; and
    an insert frame member having a header configured for releasably attaching to the electronic object.

2. The flexible membrane container of claim 1, wherein the first flexible membrane comprises multiple layers, at least one of the multiple layers comprising a permeable flow layer and at least one of the multiple layers comprising an impermeable barrier layer.

3. The flexible membrane container of claim 2, wherein the first flexible membrane comprises a first barrier layer and a second barrier layer, the permeable flow layer disposed between the first and second barrier layers, wherein the liquid dielectric coolant is configured to enter into the flow layer upon exiting the first interior volume.

4. The flexible membrane container of claim 1, wherein the opening of the flexible membrane container further comprises a frame member for mating engagement with the insert frame member.

5. The flexible membrane container of claim 4, wherein the first flexible membrane comprises multiple layers, at least one of the multiple layers comprising a permeable flow layer and at least one of the multiple layers comprising an impermeable barrier layer.

6. The flexible membrane container of claim 5, wherein the first flexible membrane comprises a first barrier layer and a second barrier layer, the permeable flow layer disposed between the first and second barrier layers, wherein the liquid dielectric coolant is configured to enter into the flow layer upon exiting the first interior volume.

7. The flexible membrane container of claim 1, further comprising a support frame disposed outside the first flexible membrane, the support frame disposed to provide shape-supporting reinforcement to the first flexible membrane.

8. The flexible membrane container of claim 1, further comprising one or more thermal exchange plates disposed in thermal communication with the first flexible membrane.

9. The flexible membrane container of claim 1, further comprising a second flexible membrane defining a second interior volume, the second flexible membrane disposed outside the first flexible membrane such that the first flexible membrane is disposed inside the second interior volume.

10. The flexible membrane container of claim 9, further comprising a support frame disposed between the first flexible membrane and the second flexible membrane, the support frame disposed to provide shape-supporting reinforcement to the first flexible membrane.

11. The flexible membrane container of claim 1, further comprising a support frame disposed inside the first flexible membrane, the support frame disposed to provide shape-supporting reinforcement to the first flexible membrane.

12. The flexible membrane container of claim 11, further comprising a second flexible membrane defining a second interior volume, the second flexible membrane disposed outside the first flexible membrane such that the first flexible membrane is disposed inside the second interior volume.

13. The flexible membrane container of claim 12, further comprising a support frame disposed between the first flexible membrane and the second flexible membrane, the support frame disposed to provide shape-supporting reinforcement to the first flexible membrane.

14. The flexible membrane container of claim 1, wherein the first flexible membrane is disposed on a tank frame, the first interior volume further comprising:
    a first plate; and
    a second plate having one or more slots or vents, the second plate disposed apart from the first plate such that an inflow space is defined between the first plate and the second plate, and the one or more slots or vents enabling fluid communication of the liquid dielectric coolant between the inflow space and the electronic object.

15. The flexible membrane container of claim 1, wherein the electronic object is disposed on a base inside the first interior volume, the base comprising:
- a substantially rigid and substantially rectangular footprint with rounded corners, and having an inlet port disposed on one or more sides of the rectangle, the inlet port disposed in fluid communication with the inflow conduit; and
- a contoured shelf that defines a tapered recess on a top side of the contoured shelf, and defines a contoured channel on a bottom side of the contoured shelf, the channel configured to promote swirling fluid flow of the liquid dielectric coolant.

16. The flexible membrane container of claim 1, further comprising an outflow regulator disposed in mating connection with the electronic object, the outflow regulator comprising:
- a trough defined by an outer wall and an inner wall, the outer wall being substantially vertical, and the inner wall disposed at an angle in relation to the outer wall and toward the center of the electronic object, a top of the outer wall disposed at a higher location than a top of the inner wall; and
- an outlet port disposed in the outer wall, the outlet port configured to permit liquid dielectric coolant to exit the first interior volume via the outlet conduit.

17. The flexible membrane container of claim 15, further comprising an outflow regulator disposed in mating connection with the electronic object, the outflow regulator comprising:
- a trough defined by an outer wall and an inner wall, the outer wall being substantially vertical, and the inner wall disposed at an angle in relation to the outer wall and toward the center of the electronic object, a top of the outer wall disposed at a higher location than a top of the inner wall; and
- an outlet port disposed in the outer wall, the outlet port configured to permit liquid dielectric coolant to exit the first interior volume via the outlet conduit.

18. The flexible membrane container of claim 1, wherein the electronic object is disposed on a base inside the first interior volume, the base comprising an inlet port and one or more channels disposed in fluid communication with the inlet port, the one or more channels disposed in an offset location in relation to a footprint of the base, thereby configured to direct the liquid dielectric coolant to heat-generating portions of the electronic object.

19. The flexible membrane container of claim 1, further comprising an outflow regulator disposed in mating connection with the electronic object, the outflow regulator comprising:
- a trough defined by an outer wall and an inner wall, a top of the outer wall disposed at a higher location than a top of the inner wall; and
- an outlet port disposed in the outer wall, the outlet port configured to permit liquid dielectric coolant to exit the first interior volume via the outlet conduit.

20. The flexible membrane container of claim 18, further comprising an outflow regulator disposed in mating connection with the electronic object, the outflow regulator comprising:
- a trough defined by an outer wall and an inner wall, a top of the outer wall disposed at a higher location than a top of the inner wall; and
- an outlet port disposed in the outer wall, the outlet port configured to permit liquid dielectric coolant to exit the first interior volume via the outlet conduit.

21. The flexible membrane container of claim 1, further comprising an inflow regulator disposed in proximity to a top of the first flexible membrane, the inflow regulator comprising apertures to disperse the flow of the liquid dielectric coolant through the plate and into the first interior volume.

22. The flexible membrane container of claim 21, further comprising a second flexible membrane defining a second interior volume, the second flexible membrane disposed outside the first flexible membrane such that the first flexible membrane is disposed inside the second interior volume.

23. The flexible membrane container of claim 22, further comprising a support frame disposed between the first flexible membrane and the second flexible membrane, the support frame disposed to provide shape-supporting reinforcement to the first flexible membrane.

24. The flexible membrane container of claim 21, further comprising a support frame disposed inside the first flexible membrane, the support frame disposed to provide shape-supporting reinforcement to the first flexible membrane.

25. The flexible membrane container of claim 24, further comprising a second flexible membrane defining a second interior volume, the second flexible membrane disposed outside the first flexible membrane such that the first flexible membrane is disposed inside the second interior volume.

26. The flexible membrane container of claim 25, further comprising a support frame disposed between the first flexible membrane and the second flexible membrane, the support frame disposed to provide shape-supporting reinforcement to the first flexible membrane.

* * * * *